(12) United States Patent
Fudaba et al.

(10) Patent No.: US 8,525,592 B2
(45) Date of Patent: Sep. 3, 2013

(54) POWER AMPLIFICATION DEVICE, TRANSMITTER, AND POWER AMPLIFICATION CONTROL METHOD

(75) Inventors: Nobukazu Fudaba, Kawasaki (JP); Hiroyoshi Ishikawa, Kawasaki (JP); Yuichi Utsunomiya, Kawasaki (JP); Kazuo Nagatani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/405,441

(22) Filed: Feb. 27, 2012

(65) Prior Publication Data

US 2012/0229209 A1 Sep. 13, 2012

(30) Foreign Application Priority Data

Mar. 10, 2011 (JP) ................. 2011-053560

(51) Int. Cl.
*H03F 1/26* (2006.01)

(52) U.S. Cl.
USPC ......... 330/149; 455/114.3; 375/296; 375/297

(58) Field of Classification Search
USPC ............... 330/149; 455/114.3; 375/296, 297
See application file for complete search history.

(56) References Cited

U.S. PATENT DOCUMENTS

| 6,141,390 A | 10/2000 | Cova |
| 6,356,146 B1 | 3/2002 | Wright et al. |
| 6,567,478 B2 * | 5/2003 | Oishi et al. ............ 375/297 |
| 6,744,315 B2 * | 6/2004 | Ezuka ............ 330/149 |
| 6,907,085 B2 * | 6/2005 | Kubo et al. ............ 375/285 |
| 7,106,133 B2 * | 9/2006 | Hamada et al. ............ 330/149 |
| 7,405,680 B2 * | 7/2008 | Funyu et al. ............ 341/118 |
| 7,539,464 B2 | 5/2009 | Suzuki et al. |
| 7,583,754 B2 | 9/2009 | Liu |
| 7,613,250 B2 | 11/2009 | Sasaki et al. |
| 7,634,238 B2 | 12/2009 | Suzuki et al. |
| 7,848,452 B2 * | 12/2010 | Hayashi et al. ............ 375/297 |
| 2010/0194474 A1 * | 8/2010 | Ishikawa et al. ............ 330/149 |

FOREIGN PATENT DOCUMENTS

| JP | 2006-505160 | 2/2006 |
| JP | 2006-246398 | 9/2006 |
| JP | 2007-13947 | 1/2007 |
| JP | 2007-20157 | 1/2007 |

* cited by examiner

*Primary Examiner* — Patricia Nguyen
(74) *Attorney, Agent, or Firm* — Fujitsu Patent Center

(57) ABSTRACT

A power amplifier amplifies a signal. An error signal calculating unit calculates an error signal in accordance with an input signal and an output from the power amplifier. A distortion compensation unit performs predistortion on the input signal by using distortion compensation coefficients that are generated in accordance with a plurality of delay signals obtained by giving different amounts of delay to the input signal and by using an error signal and outputs the input signal subjected to the predistortion to the signal amplifying unit. A tap interval control unit controls the delay intervals of the delay signals that are used for the predistortion performed by the distortion compensation unit in accordance with signal correlation information calculated from the input signal.

13 Claims, 13 Drawing Sheets

FIG.6

| BANDWIDTH RATIO (BANDWIDTH/ MAXIMUM BANDWIDTH) | CONTROL SIGNAL | | | | |
|---|---|---|---|---|---|
| | $LUT_0$ | $LUT_1$ | $LUT_2$ | $LUT_3$ | $LUT_4$ |
| 0 TO 0.25 | ON | OFF | OFF | OFF | ON |
| 0.25 TO 0.5 | ON | OFF | ON | OFF | ON |
| 0.5 TO 0.75 | ON | ON | OFF | ON | OFF |
| 0.75 TO 1.0 | ON | ON | ON | ON | ON |

| BANDWIDTH RATIO (BANDWIDTH/ MAXIMUM BANDWIDTH) | CONTROL SIGNAL ||||| |
|---|---|---|---|---|---|
| | $LUT_0$ | $LUT_1$ | $LUT_2$ | $LUT_3$ | $LUT_4$ |
| $Pcorr(D) \geq$ THRESHOLD 611 | ON | OFF | OFF | OFF | ON |
| THRESHOLD 611 > $Pcorr(D) \geq$ THRESHOLD 612 | ON | OFF | ON | OFF | ON |
| THRESHOLD 612 > $Pcorr(D) \geq$ THRESHOLD 613 | ON | ON | OFF | ON | OFF |
| THRESHOLD 613 > $Pcorr(D)$ | ON | ON | ON | ON | ON |

POWER AMPLIFICATION DEVICE, TRANSMITTER, AND POWER AMPLIFICATION CONTROL METHOD

CROSS-REFERENCE TO RELATED APPLICATION

This application is based upon and claims the benefit of priority of the prior Japanese Patent Application No. 2011-053560, filed on Mar. 10, 2011, the entire contents of which are incorporated herein by reference.

FIELD

The embodiments discussed herein are directed to a power amplification device, a transmitter, and a power amplification control method.

BACKGROUND

In recent years, with the increased speed of wireless communications, the bandwidth and dynamic range of transmission signals have increased. Under these conditions, to reduce the degradation of the quality of signals to the minimum, power amplifiers having high linearity are needed. Furthermore, at the same time, from the viewpoint of reducing device size and the operation costs and from the viewpoint of environmental issues, there is also a growing need for power amplifiers that operate with high power conversion efficiency.

In commonly used power amplifiers, the linearity and the power conversion efficiency have a conflicting relationship with each other. For example, it is possible to reduce the amount of out-of-band distortion by operating a power amplifier in a linear region in which the power amplifier is backed off from its saturation level. However, in such a case, the power conversion efficiency is considerably low, thus increasing the power consumption of the power amplifiers. Accordingly, to have both satisfactory linearity and the power conversion efficiency, linearity should be maintained by operating the power amplifier in a nonlinear region in which the power conversion efficiency is high and also using distortion compensation that removes nonlinear distortion that is generated when the power amplifiers is operated in this nonlinear region. A predistortion method (hereinafter, referred to as a "PD method"), which is a method of the distortion compensation, is a technique for enhancing the linearity of output of a power amplifier by multiplying the inverse characteristics of the nonlinear distortion of the power amplifier by a transmission signal. The multiplication of the PD method mentioned here is done in complex region. An example of such PD methods includes a conventional technique for suppressing spurious emissions in accordance with the number of carriers, which is equal to the bandwidth of the transmission signal. Furthermore, there is a conventional technique for performing distortion compensation using look-up tables associated with multiple frequency bands.

In power amplifiers that can operate with high efficiency, it is known that a memory effect phenomenon occurs. A memory effect phenomenon is a phenomenon in which, in a power amplifier at a certain time, an output with respect to the input is affected by the past input data. Accordingly, when using distortion compensation, on a power amplifier that operates with high power efficiency, using a PD method that does not support the compensation of the memory effect in which a distortion compensation coefficient is determined only by using the signal amplitude obtained at the current time, it is difficult to obtain the desired distortion suppression effect. Accordingly, in order to obtain the desired distortion suppression effect by using a power amplifier that operates with high efficiency, distortion compensation using the PD method that supports the compensation of the memory effect (hereinafter, referred to as a "memory PD") has been proposed in which a predistortion signal is generated by using, in addition to the current time, the past data. There is one type of memory PDs that has a transversal filter structure by using both a transmission signals and distortion compensation coefficients to generate a predistortion signal. In the description below, a predistortion signal generated by using the transversal filter is referred to as a transversal-filter-type predistortion signal.

In the following, an example of the operation of a conventional power amplification device that uses transversal-filter-type predistortion signals will be described. In this example, it is assumed that a predistortion signal generating unit is provided in both forward and feedback paths. The power amplification device obtains N distortion compensation coefficients by using a transmission signal that is delayed by a delay element by a maximum of N clocks. Then, the obtained distortion compensation coefficients are input to a predistortion signal processing unit in a forward path having a transversal filter structure. Then, the distortion compensation coefficients are multiplied by transmission signals having the same delay time. A signal obtained by adding each of the multiplication results is output as a predistortion signal. The predistortion signal generating unit in the forward path generates, using the transmission signal and the distortion compensation coefficients provided by the coefficient generating unit, a predistortion signal having the inverse characteristics of the nonlinear distortion of the power amplifier. Then, the predistortion signal in the forward path is subjected to digital-to-analog (DA) conversion; is up-converted to a carrier frequency; and then is input to the power amplifier. A part of the output from the power amplifier, in which nonlinear distortion is removed due to the predistortion, is looped back by a directional coupler; is subjected to down-conversion, analog to digital (AD) conversion, and demodulation; and becomes a digital feedback signal. The predistortion signal generating unit in the feedback path has the same configuration as that of the predistortion signal generating unit in the forward path. The predistortion signal in the feedback path performs predistortion on the feedback signal. Then, the power amplification device obtains update information on the distortion compensation coefficients to minimize the power of an error signal that is the difference between the predistortion signals of the forward path and the feedback path.

Furthermore, for amplifiers that use transversal-filter-type predistortion signals, there is also a conventional technique for obtaining a distortion compensation coefficient using a power series. Furthermore, there is also a conventional technique for generating a predistortion signal by obtaining in-band and out-of-band signals subjected to predistortion.

Patent Document 1: Japanese National Publication of International Patent Application No. 2006-505160
Patent Document 2: Japanese Laid-open Patent Publication No. 2007-13947
Patent Document 3: Japanese Laid-open Patent Publication No. 2007-20157
Patent Document 4: Japanese Laid-open Patent Publication No. 2006-246398
Patent Document 5: U.S. Pat. No. 6,141,390
Patent Document 6: U.S. Pat. No. 6,356,146

In a conventional distortion compensation method using a transversal-filter-type predistortion signal, delay time $\tau$ due to a tap that gives a delay to the input signal is determined on the basis of the maximum bandwidth of the transmission signal and the tap interval is fixed regardless of a change in transmission signal properties. This applies to both the conventional technique that uses a power series and the conventional technique that performs predistortion on in-band and out-of-band signals. Accordingly, if the correlation between adjacent data sample points of an input signal is high, i.e., if the signal bandwidth is narrow due to a change in carrier configuration or if the power of a control channel is significantly high with respect to the power of a data channel, there may be a case in which distortion compensation coefficients may not converge to their optimum values. The reason for this is that, if the correlation between the adjacent data sample points of an input signal is high, the values of the adjacent data sample points of signals that are output from taps becomes very similar. Accordingly, when updating a distortion compensation coefficient, the effect of the adjacent data sample points and other distortion compensation coefficients becomes strong; therefore, in a coefficient update algorithm, such as a least mean square (LMS) algorithm, that is based on a steepest-descent method, the amount of the update to the coefficients is not correctly obtained. As described above, because the distortion compensation coefficients are not converged to their optimum values, there is a problem in that distortion suppression performance is degraded.

SUMMARY

According to an aspect of an embodiment of the invention, a power amplification device includes an amplifying unit that amplifies an input signal; an error signal calculating unit that calculates an error signal in accordance with an output from the amplifying unit and the input signal; a distortion compensation unit that performs predistortion on the input signal by using distortion compensation coefficients and that outputs the input signal subjected to the predistortion to the amplifying unit, the distortion compensation coefficients being generated in accordance with delay signals, which are obtained by giving different amounts of delay to the input signal, and being generated in accordance with the error signal; and a delay time control unit that controls intervals of the delay signals that are used for the predistortion performed by the distortion compensation unit in accordance with correlation information on the input signal.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 6 is a table of a control signal setting generated when N=4 clock delay if the coefficient generating unit has LUTs;

DESCRIPTION OF EMBODIMENTS

Preferred embodiments of the present invention will be explained with reference to accompanying drawings. The power amplification device, the transmitter, and the power amplification control method disclosed in the present invention are not limited to the embodiment described below.

[a] First Embodiment

Figure 1:
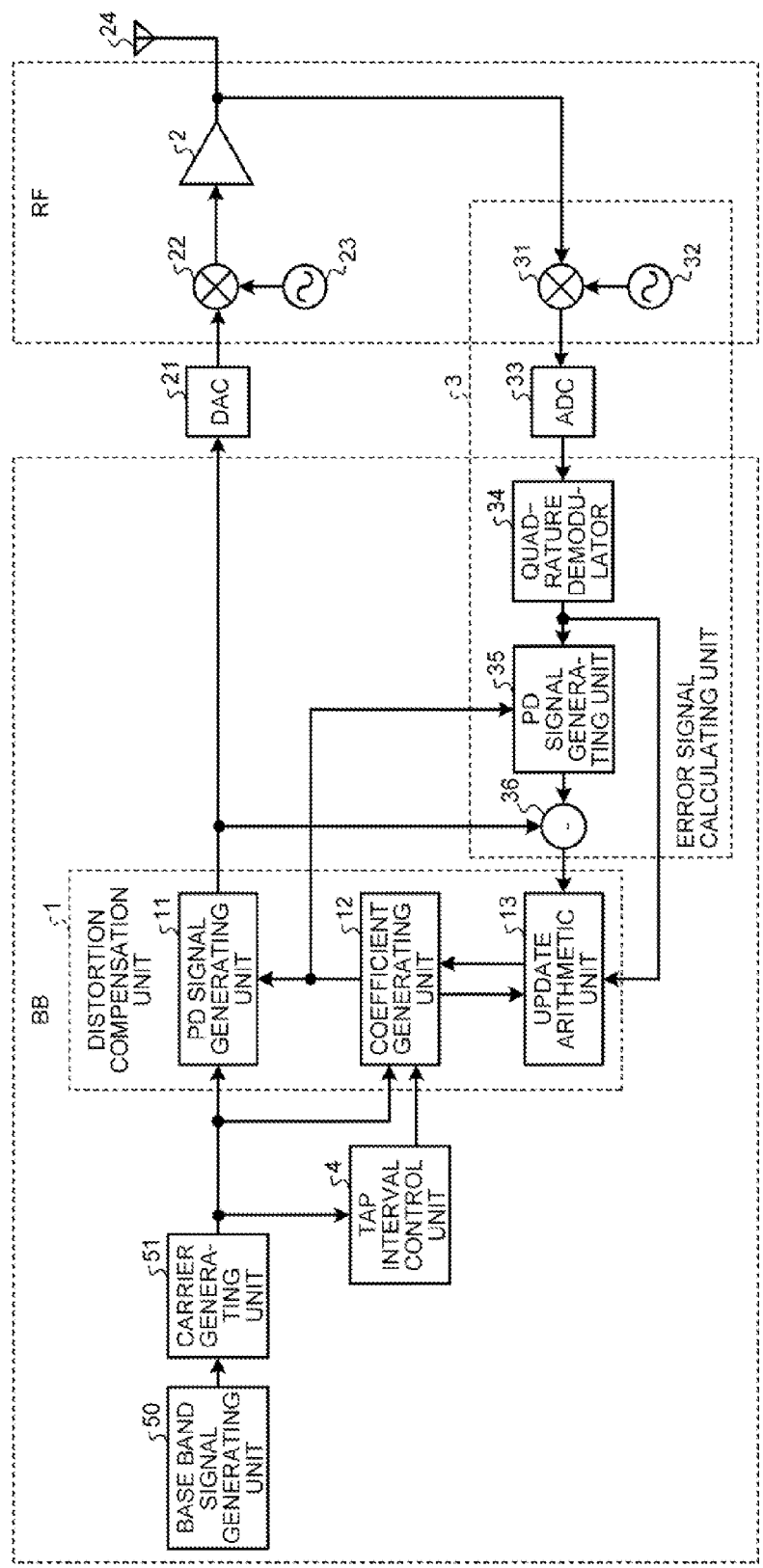
FIG. 1 is a schematic diagram illustrating a configuration of a transmitter according to the first embodiment.
Figure 2:
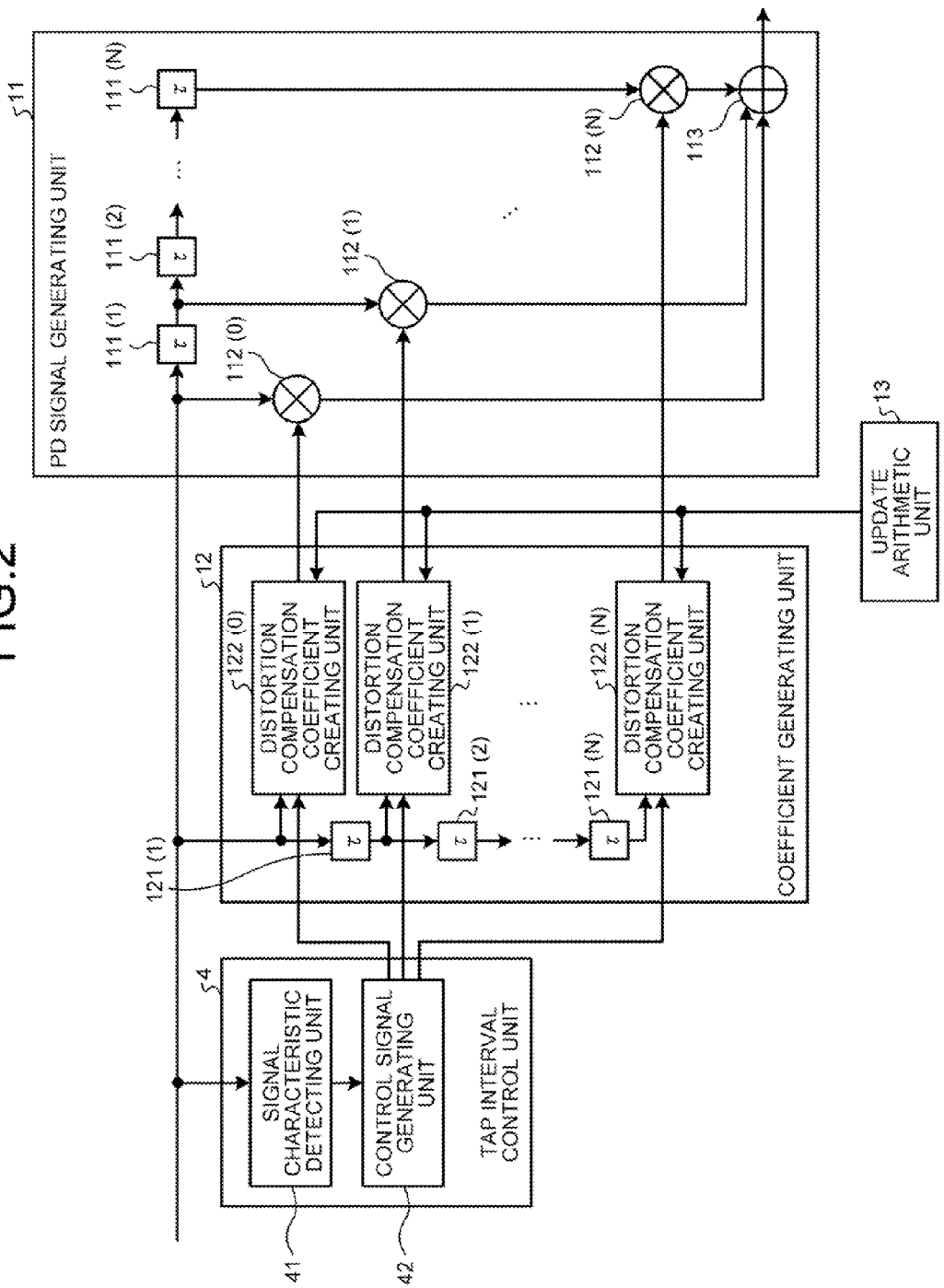
FIG. 2 is a schematic diagram illustrating, in detail, a PD signal generating unit and a coefficient generating unit in the transmitter according to the first embodiment.

FIG. 1 is a schematic diagram illustrating the configuration of a transmitter according to the first embodiment. FIG. 2 is a schematic diagram illustrating, in detail, a PD signal generating unit and a coefficient generating unit in the transmitter according to the first embodiment.

As illustrated in FIG. 1, the transmitter according to the first embodiment includes a distortion compensation unit 1, a power amplifier 2, an error signal calculating unit 3, a tap interval control unit 4, a digital to analog convertor (DAC) 21, an up-converter 22, an oscillator 23, a baseband signal generating unit 50, and a carrier generating unit 51. The distortion compensation unit 1, the power amplifier 2, the error signal calculating unit 3, the tap interval control unit 4, the DAC 21, the up-converter 22, and the oscillator 23 are an example of a "power amplification device".

The baseband signal generating unit 50 generates a baseband signal. The baseband signal generating unit 50 outputs the generated baseband signal to the carrier generating unit 51.

The carrier generating unit 51 receives an input of the baseband signal from the baseband signal generating unit 50. Then, the carrier generating unit 51 modulates the received baseband signal and generates a multi-carrier signal that corresponds to a transmission signal. The carrier generating unit 51 outputs the generated transmission signal to the distortion compensation unit 1 and the tap interval control unit 4.

As illustrated in FIG. 1, the distortion compensation unit 1_includes a PD signal generating unit 11, a coefficient generating unit 12, and an update arithmetic unit 13. As illustrated in FIG. 2, the PD signal generating unit 11 includes N taps, i.e., taps 111(1) to 111(N) (N is a positive integer); N multipliers, i.e., multipliers 112(0) to 112(N); and an adder 113. In a description below, the taps are simply referred to as the tap 111 unless the taps 111(1) to 111(N) are distinguished. Similarly, the multipliers are simply referred to as the multiplier 112 unless the multipliers 112(0) to 112(N) are distinguished.

As illustrated in FIG. 2, the PD signal generating unit 11 includes a tap delay line to which N taps 111 that give an integer multiple of delay time τ are connected in series. The PD signal generating unit 11 receives an input of the transmission signal from the carrier generating unit 51. Hereinafter, the input transmission signal is referred to as an "input signal".

Then, the PD signal generating unit 11 sequentially allows the input signal to pass through each tap 111 from the tap 111(1) to the tap 111(N) arranged on the tap delay line. Each of the taps 111 gives the delay time τ to the input signal that sequentially passes each of the taps 111. Then, the PD signal generating unit 11 branches the input signal immediately after the input signal passes each of the taps 111 and supplies the input signal to the multiplier 112. Specifically, the PD signal generating unit 11 generates N signals obtained by giving τ, 2τ, ..., Nτ delays to the input signal. In the following, a description will be given with the assumption that an original input signal is a signal to which a zero delay is given; therefore, N+1 signals, which include the input signal and N signals to each of which corresponding amount of delay is given by each of the taps 111, is referred to as a "delay signal".

The multiplier 112 includes one multiplier associated with an input signal to which a delay has not been given and N multipliers associated with an output from each of the taps 111. The multiplier 112(0) receives an input of the input signal. The multipliers 112(1) to 112(N) receive an input of the signal that is output from the corresponding tap 111. Specifically, each of the N+1 multipliers 112 receives an input of each corresponding delay signal. Furthermore, the multiplier 112 receives a distortion compensation coefficient from the coefficient generating unit 12, which will be described later. More specifically, the multiplier 112($i$) receives an input of a distortion compensation coefficient from a distortion compensation coefficient generating unit 122($i$), where, i=0, 1, ..., N. Then, the multiplier 112 performs complex multiplication on the input delay signal and the distortion compensation coefficient and outputs the multiplication result to the adder 113. If 0 is input as the distortion compensation coefficient, the multiplier 112 outputs 0.

The adder 113 receives an input of the multiplication result from each of the multipliers 112. The adder 113 adds the input N+1 multiplication results and generates a transmission signal (hereinafter, referred to as a "predistortion signal") subjected to the predistortion. The predistortion signal has the inverse characteristics of the nonlinear distortion of the power amplifier 2. If 0 is input from the multiplier 112, the delay signal that is input to the corresponding multiplier 112 is not used for generating a predistortion signal.

In the following, a description is given by a case when N=4. In such a case, the PD signal generating unit 11 includes the taps 111(1) to 111(4) and the multipliers 112(0) to 112(4). For example, if the multiplier 112(1) and the multiplier 112(3) receive 0 as the distortion compensation coefficient, each of the multiplier 112(1) and the multiplier 112(3) outputs 0. In other words, the delay signals that are output from the tap 111(1) and the tap 111(3) are not used to generate the predistortion signal. Accordingly, in such a case, the state becomes the same state in which the operation is performed at a tap interval 2τ. By inputting 0 to the multiplier 112 as the distortion compensation coefficient, the delay signals can be thinned out, thus the delay interval between the delay signals can be adjusted.

Then, the adder 113 outputs the generated predistortion signal to the DAC 21. Furthermore, the adder 113 outputs the predistortion signal to a subtracter 36.

The update arithmetic unit 13 receives an input of an error signal from the subtracter 36. Furthermore, the update arithmetic unit 13 receives an input of the distortion compensation coefficient from the coefficient generating unit 12. Furthermore, the update arithmetic unit 13 receives an input of the feedback signal from a quadrature demodulator 34. Then, by using an LMS algorithm, which is a type of a steepest-descent method, in accordance with the received error signal and the received feedback signal, the update arithmetic unit 13 obtains a new distortion compensation coefficient. Thereafter, the update arithmetic unit 13 supplies the new distortion compensation coefficient to the coefficient generating unit 12. By doing so, each of the distortion compensation coefficients in each of the distortion compensation coefficient generating units 122 in the coefficient generating unit 12 is updated.

Figure 3:
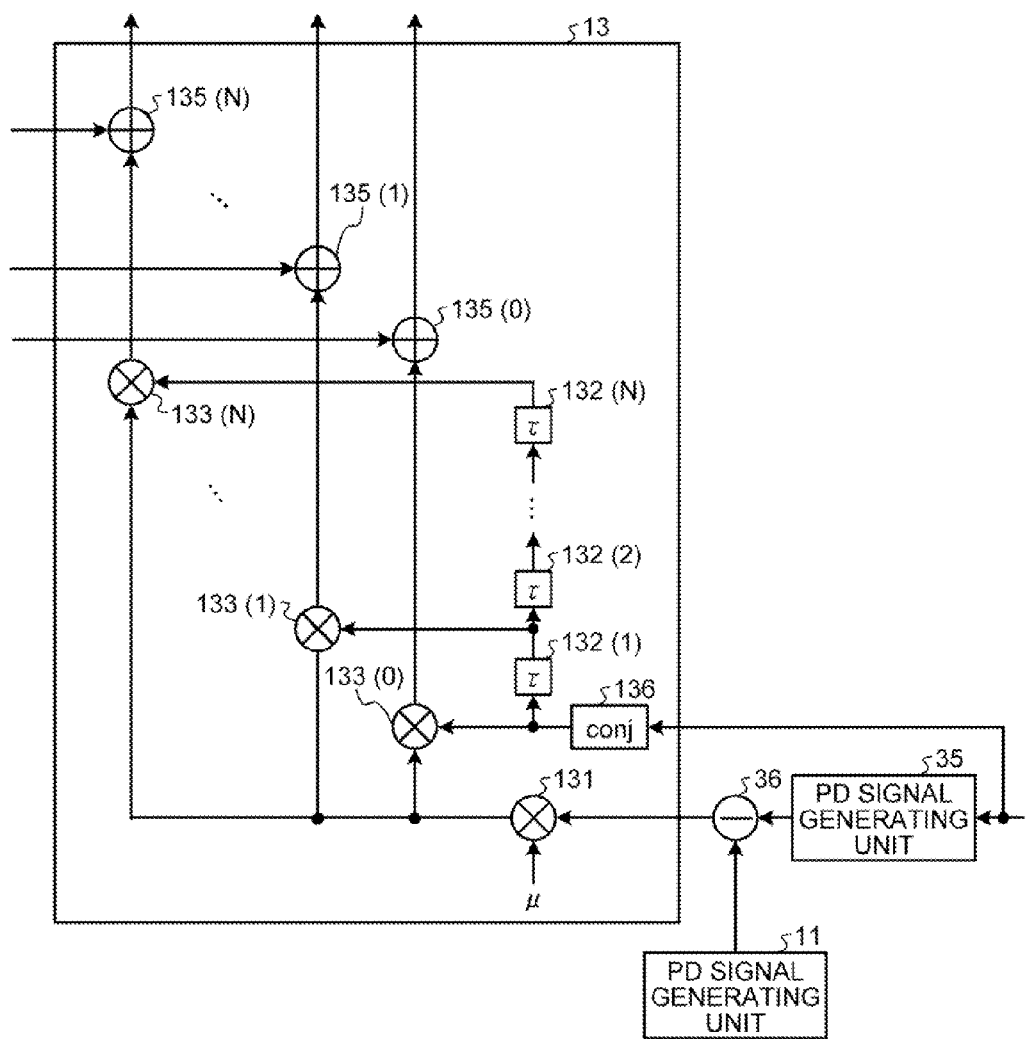
FIG. 3 is a schematic diagram illustrating, in detail, an update arithmetic unit according to the first embodiment.

FIG. 3 is a schematic diagram illustrating, in detail, an update arithmetic unit according to the first embodiment. In the following, the update arithmetic unit 13 according to the first embodiment will be described with reference to FIG. 3.

As illustrated in FIG. 3, the update arithmetic unit 13 according to the first embodiment includes one multiplier 131, N+1 multipliers 133(0) to 133(N), and N taps 132(1) to 132(N). Furthermore, the update arithmetic unit 13 includes N+1 adders 135(0) to 135(N) and a complex conjugate calculating unit (conj) 136.

The multiplier 131 receives an error signal (hereinafter, referred to as an "e(t)") from the subtracter 36.

If an input signal is represented by x(t), u(t) represented by Equation 1 is the signal supplied from the PD signal generating unit 11.

$$u(t) = \sum_{i=0}^{N} x(t-i) \times LUT_i\{a(t-i)\} \quad (1)$$

Furthermore, if a feedback signal is represented by y(t), v(t) represented by Equation 2 is the signal supplied from a PD signal generating unit 35.

$$v(t) = \sum_{i=0}^{N} y(t-i) \times LUT_i\{a(t-i)\} \quad (2)$$

Accordingly, the error signal e(t) supplied to the multiplier 131 is given by u(t)−v(t).

Then, the multiplier 131 multiplies a step size μ by the error signal e(t) and calculates an error signal (μ×e(t)) obtained by performing the scaling on the error signal e(t) using the step size μ. Then, the multiplier 131 outputs, to each of the multipliers 133(0) to 133(N), the error signal (μ×e(t)) subjected to the scaling using the step size μ.

The conj 136 receives an input of the feedback signal from the quadrature demodulator 34. Then, the conj 136 obtains a complex conjugate y(t)* of the feedback signal y(t) and outputs it to the multiplier 133(0) and the tap 132(0). Here, the symbol "*" represents a complex conjugate arithmetic.

The tap 132(1) gives a delay τ to the complex conjugate y(t)* and outputs it to the multiplier 133(0) and the tap 132(2). In this way, the tap 132(j) (1≦j≦N-1) gives the delay τ to the received signal and outputs it to the multiplier 133(j) and the tap 132(j+1). However, because the tap 132(N) does not have the subsequent tap, the operation performed by the tap 132(N) is just to gives the delay τ to the received signal and outputs it to the multiplier 133(N). In the following, a signal to which a delay τ has been given by the tap 132(i) and a signal to which the delay has not been given are all represented by y(t-i)* (0≦i≦N). The signal y(t-i)* is the complex conjugate of the feedback signal y(t-i) obtained i clock before the current time t. In a case when i=0, y(t-i)* is the complex conjugate of the original feedback signal y(t).

The multiplier 133(i) multiplies the error signal (μ×e(t)) subjected to the scaling using the step size μ by complex conjugate y(t-i)* of the feedback signal to which a delay iτ is given, thereby obtaining μ×e(t)×y(t-i)*. Then, the multiplier 133(i) outputs the multiplication result μ×e(t)×y(t-i)* to the adder 135(i).

The adder 135(i) receives an input of the distortion compensation coefficient $LUT_i$ {a(t-i)} that is output from the distortion compensation coefficient generating unit 122(i). Furthermore, the adder 135(i) receives an input of the multiplication result μ×e(t)×y(t-i)* from the multiplier 133(i). Then, the adder 135(i) adds the distortion compensation coefficient $LUT_i$ {a(t-i)} and the multiplication result μ×e(t)×y(t-i)* to obtain the $LUT_i$ {a(t-i)}+μ×e(t)×y(t-i)* as a new distortion compensation coefficient in the distortion compensation coefficient generating unit 122(i). Then, the adder 135(i) supplies the calculated distortion compensation coefficient $LUT_i$ {a(t-i)}+μ×e(t)×y(t-i)* to the distortion compensation coefficient generating unit 122(i).

As illustrated in FIG. 2, the tap interval control unit 4 includes a signal characteristic detecting unit 41 and a control signal generating unit 42.

The signal characteristic detecting unit 41 receives, from the carrier generating unit 51, the input signal that is the same signal as that received by the PD signal generating unit 11. Then, the signal characteristic detecting unit 41 detects a characteristic of the input signal. Then, the signal characteristic detecting unit outputs the detected characteristic of the input signal to the control signal generating unit 42.

Figure 4:
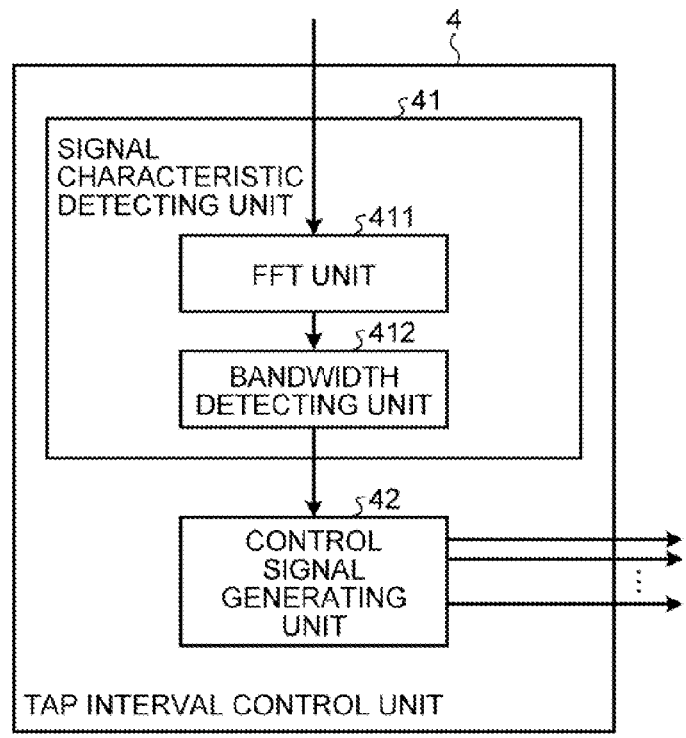
FIG. 4 is a block diagram illustrating, in detail, a signal characteristic detecting unit according to the first embodiment.

In the first embodiment, the signal characteristic detecting unit 41 detects, as the characteristic of the signal, the bandwidth of a signal. FIG. 4 is a block diagram illustrating, in detail, a signal characteristic detecting unit according to the first embodiment. As illustrated in FIG. 4, the signal characteristic detecting unit 41 includes a fast Fourier transform (FFT) unit 411 and a bandwidth detecting unit 412. The FFT unit 411 performs the fast Fourier transformation on the input signal that is input from the carrier generating unit 51 and convert a time domain signal to a frequency domain signal. Then, the FFT unit 411 outputs spectrum information that is an amplitude characteristic to the bandwidth detecting unit 412.

Figure 5:
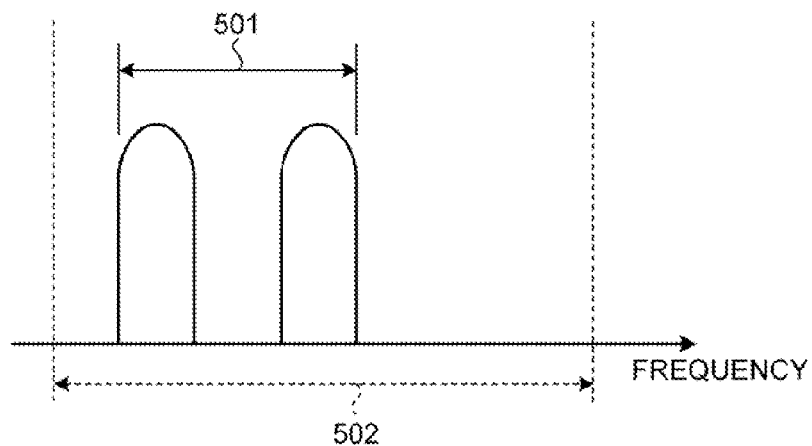
FIG. 5 is a schematic diagram illustrating the detecting of bandwidth using FFT according to the first embodiment.

The bandwidth detecting unit 412 receives an input of the spectrum information from the FFT unit 411. Then, as illustrated in FIG. 5, the bandwidth detecting unit 412 detects, from the spectrum information, a bandwidth 501 occupied by the input signal. FIG. 5 is a schematic diagram illustrating the detecting of a bandwidth using FFT according to the first embodiment. In FIG. 5, the horizontal axis indicates the frequency and the vertical axis indicates the amplitude of the spectrum. As illustrated in FIG. 5, the maximum bandwidth of the input signal is represented by a maximum bandwidth 502. However, in practice, an input signal does not always uses all of the maximum bandwidth 502. Accordingly, the bandwidth detecting unit 412 detects, as the bandwidth 501, between the lowest frequency and the highest frequency in which the spectrum information is present. Then, the bandwidth detecting unit 412 outputs the detected bandwidth information to the control signal generating unit 42.

The control signal generating unit 42 receives an input of the characteristic of the input signal from the signal characteristic detecting unit 41. Then, the control signal generating unit 42 in advance previously stores therein a control signal setting that is associated with the characteristic of the input signal. Then, the control signal generating unit 42 specifies a control signal setting associated with the characteristic of the input signal and outputs the control signal to the coefficient generating unit 12. In the following, a specific example of the control signal setting will be described with reference to FIG. 6. FIG. 6 is a table of a control signal setting generated when N=4 clock delay if the coefficient generating unit has LUTs.

In the first embodiment, a description is given by a case when N=4. A description will be given with the assumption that the ratio of the bandwidth detected by the bandwidth detecting unit 412 to the maximum bandwidth of the input signal is the bandwidth ratio. As illustrated in FIG. 6, for example, if the bandwidth ratio is 1.0, i.e., if the transmission is performed at the maximum bandwidth, the control signal generating unit 42 stores therein the control signal setting such that all the coefficients that are output from the look-up tables (LUTs) are enabled, as illustrated in a row 701 in the item of the control signal. Furthermore, if the bandwidth ratio is 0.5, i.e., if the transmission is performed at half of the maximum bandwidth, the control signal generating unit 42 stores therein the control signal setting such that the control signals that are input to $LUT_1$ and $LUT_3$ are disabled, as illustrated in a row 702 in the item of the control signal. By disabling the LUT, the distortion compensation coefficient, which is supplied from the distortion compensation coefficient generating unit 122 that includes the disabled LUT to the PD signal generating unit 11, becomes 0.

The coefficient generating unit 12 includes N taps 121(1) to 121(N) and N+1 distortion compensation coefficient generating units 122(0) to 122(N). In the following, the tap is simply referred to as the tap 121 unless the taps 121(1) to 121(N) are distinguished. Similarly, the distortion compensation coefficient generating unit is simply referred to as the distortion compensation coefficient generating unit 122 unless the distortion compensation coefficient generating units 122(0) to 122(N) are distinguished.

The coefficient generating unit 12 includes a tap delay line to which N taps 121 are connected in series. The coefficient generating unit 12 sequentially allows the input signal to pass through each tap 121 from the tap 121(1) to the tap 121(N) arranged on the tap delay line. Each of the taps 121 gives the delay time τ to the input signal that passes each of the taps 121. Then, the coefficient generating unit 12 branches the input signal immediately after the input signal passes each of the taps 121 and supplies the input signal to the distortion compensation coefficient generating unit 122. Specifically, the coefficient generating unit 12 generates N signals obtained by giving $\tau, 2\tau, \ldots, N\tau$ delays to the input signal. Then, the coefficient generating unit 12 supplies the signal, in which an i$\tau$ delay is given to the input signal, to the distortion compensation coefficient generating unit 122($i$) ($i$=0, 1, ..., N). Specifically, the input signal, which is obtained i clock before the current time, is input to the distortion compensation coefficient generating unit 122($i$). Here, in a case when i=0, a delay of 0 is given, i.e., the original input signal that does not give a delay is supplied.

In the first embodiment, a description will be given of a case in which each of the distortion compensation coefficient generating units 122 includes an LUT. Specifically, the distortion compensation coefficient generating units 122(0) to 122(N) include $LUT_0$ to $LUT_N$, respectively. Furthermore, a description will be given of a case in which each of the distortion compensation coefficient generating units 122 obtains, using the LUT included in the corresponding distortion compensation coefficient generating unit 122, a distortion compensation coefficient.

The distortion compensation coefficient generating unit 122 receives an input of a control signal that is output from the control signal generating unit 42. Here, the distortion compensation coefficient generating unit 122 receives, as a control signal from the control signal generating unit 42, a signal that is used to determine whether an LUT included in the corresponding distortion compensation coefficient generating unit 122 is to be disabled.

Furthermore, the distortion compensation coefficient generating unit 122 receives a new distortion compensation coefficient from the update arithmetic unit 13. Then, if the LUT is enabled, i.e., if a control signal that disables the LUT is not received, the distortion compensation coefficient generating unit 122 overwrites, with a new distortion compensation coefficient, the old distortion compensation coefficient stored at an address of the LUT associated with the new distortion compensation coefficient that is input from the update arithmetic unit 13 and updates it. In contrast, if a control signal that disables the LUT is received, the distortion compensation coefficient generating unit 122 stores the distortion compensation coefficient without processing anything, i.e., without overwriting the distortion compensation coefficient stored at the address of the LUT associated with the new distortion compensation coefficient that is input from the update arithmetic unit 13.

Then, the distortion compensation coefficient generating unit 122($i$) receives, from the tap 121($i$), a signal to which an i$\tau$ delay is given to the input signal, i.e., an input of the signal obtained i clock before the current time. Here, in a case when i=0, the distortion compensation coefficient generating unit 122(0) receives the input signal that is input from the carrier generating unit 51.

Then, if the distortion compensation coefficient generating unit 122 receives the signal that disables the LUT from the control signal generating unit 42, the distortion compensation coefficient supplies 0 to the multiplier 112 in the PD signal generating unit 11. Furthermore, if the LUT is enabled, i.e., if a signal that disables the LUT is not received from the control signal generating unit 42, the distortion compensation coefficient generating unit 122($i$) outputs, as a distortion compensation coefficient, the $LUT_i$ {a(t–i)} to the multiplier 112($i$) in the PD signal generating unit 11. Here, a(t–i) is an address of the $LUT_i$ generated from an input signal x(t–i) that is obtained i clock before the current time t. For example, a(t–i) is calculated using a common logarithm ($\log_{10}$) of the amplitude of the input signal x(t–i) obtained i clock before the current time t.

Figure 7:
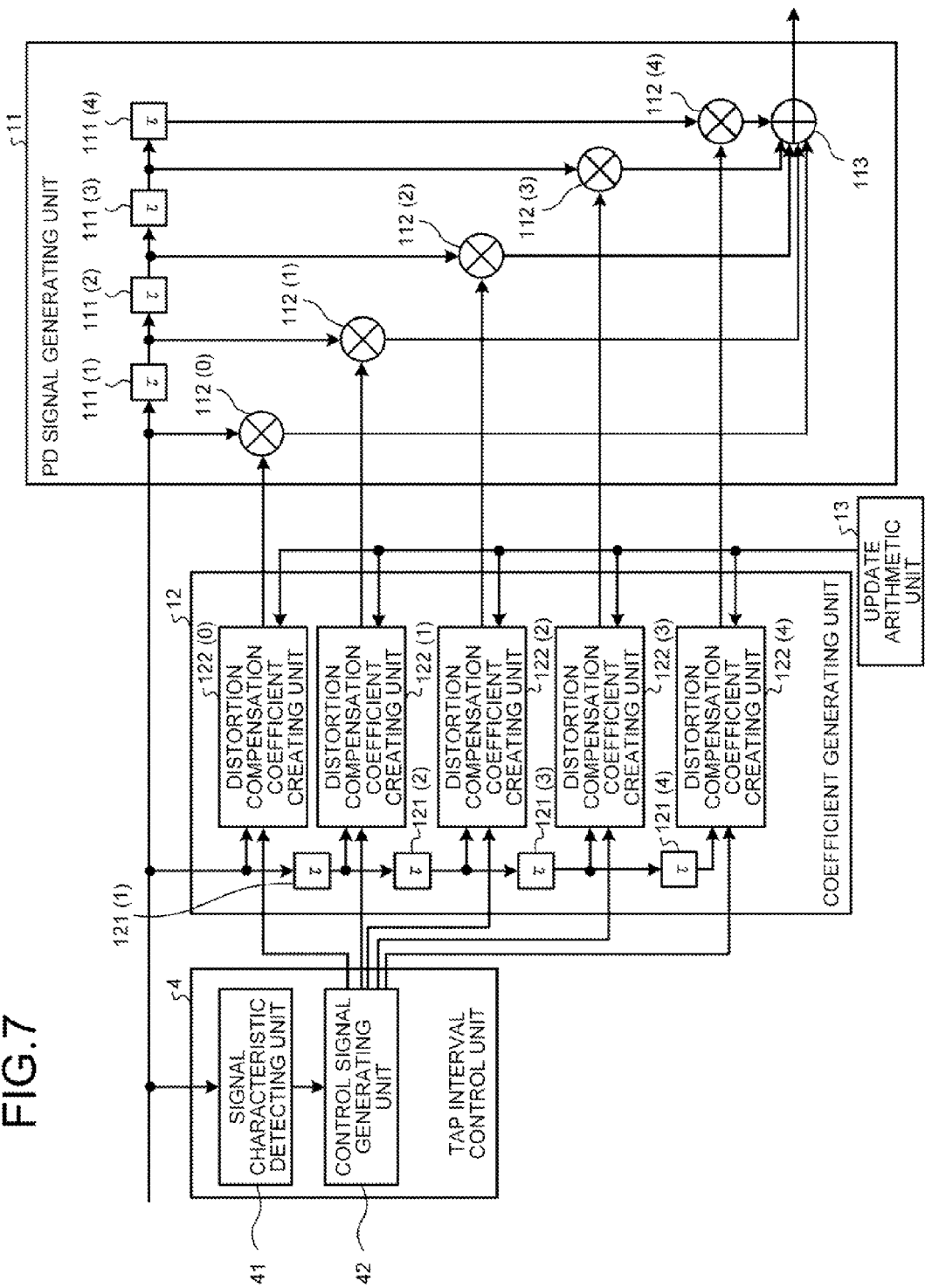
FIG. 7 is a schematic diagram illustrating an example of the operation performed in a case when the bandwidth ratio is 0.5 and when N=4.

In the following, the operation performed in a case when the bandwidth ratio is 0.5 and when N=4 will be described with reference to FIG. 7. FIG. 7 is a schematic diagram illustrating an example of the operation performed in a case when the bandwidth ratio is 0.5 and when N=4. In this case, the distortion compensation coefficient generating unit 122 (1) and 122(3) receives a control signal (off signal) that disables the $LUT_1$ and the $LUT_3$, respectively. In such a case, the distortion compensation coefficient generating unit 122(1) supplies 0 as the distortion compensation coefficient to the multiplier 112(1) in the PD signal generating unit 11. Furthermore, the distortion compensation coefficient generating unit 122(3) supplies 0 as the distortion compensation coefficient to the multiplier 112(3). If 0 is supplied to the multiplier 112, the multiplication result becomes 0. Accordingly, the signal that is input to the corresponding multiplier is not used for generating the PD signal. Furthermore, the distortion compensation coefficient generating unit 122(0) outputs the $LUT_0$ {a(t)} to the multiplier 112(0) in the PD signal generating unit 11. Furthermore, the distortion compensation coefficient generating unit 122(2) outputs the $LUT_2$ {a(t–2)} to the multiplier 112(2) in the PD signal generating unit 11. Furthermore, the distortion compensation coefficient generating unit 122(4) outputs the $LUT_4$ {a(t–4)} to the multiplier 112(4) in the PD signal generating unit 11. In such a case, 0 is output from each of the multiplier 112(1) and the multiplier 112(3). Accordingly, by adding the multiplication results of the multiplier 112(0), the multiplier 112(2), and the multiplier 112(4), the adder 113 generates a predistortion signal. In such a case, by the distortion compensation coefficient generating unit 122(1) and the distortion compensation coefficient generating unit 122(3) supplying 0 as the distortion compensation coefficient, it is possible to operate the PD signal generating unit 11 such that the delay time (tap interval) of the tap is 2$\tau$.

Figure 8:
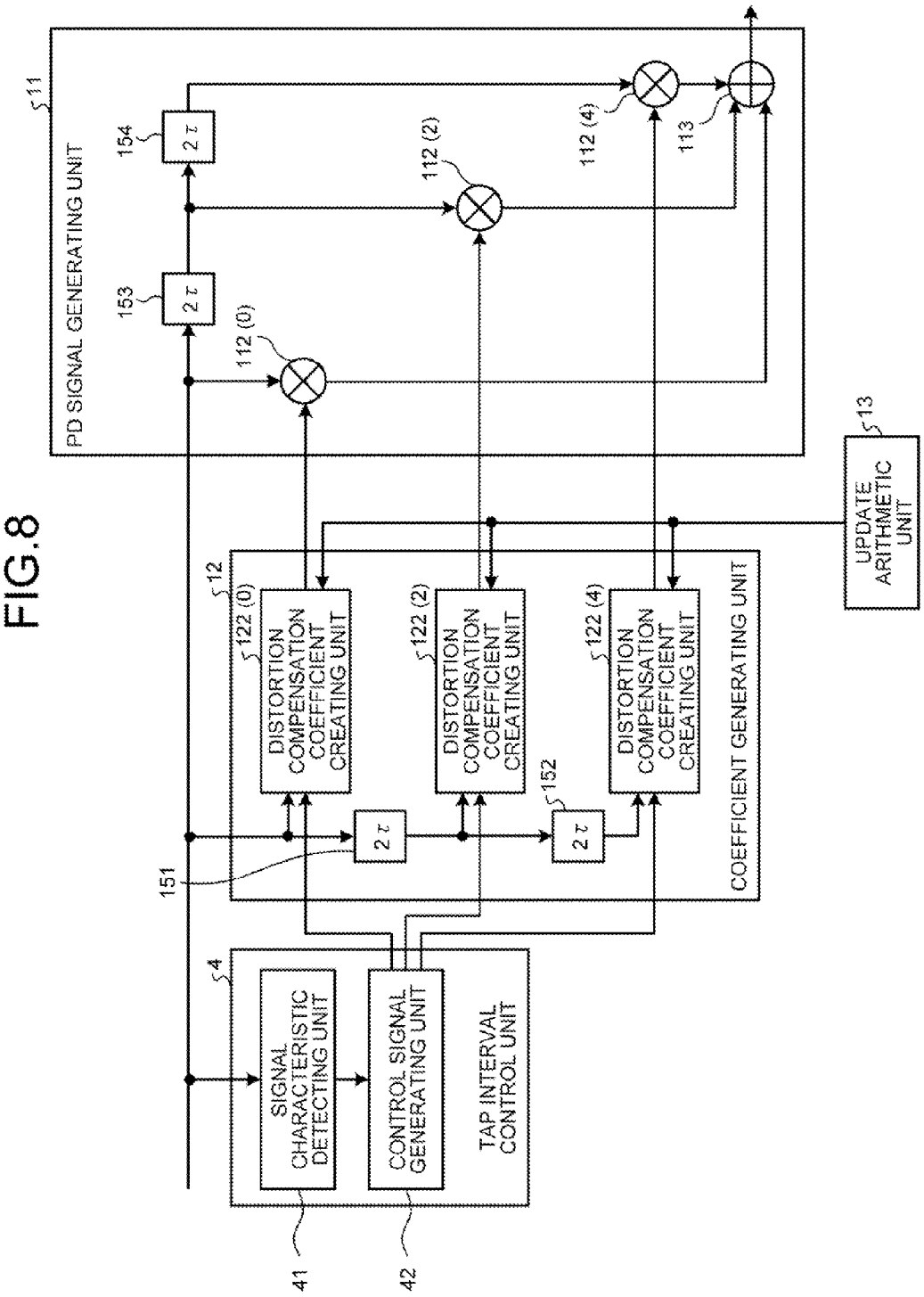
FIG. 8 is a schematic diagram illustrating, by using a tap that gives $2\tau$ delay, the operation that is performed by a tap interval control unit, the coefficient generating unit, and the PD signal generating unit and is performed in a case when the bandwidth ratio is 0.5 and when N=4.

In other words, in this case, the operation performed by the tap interval control unit 4, the coefficient generating unit 12, and the PD signal generating unit 11 according to the first embodiment is the same as that performed by the tap interval control unit 4, the coefficient generating unit 12, and the PD signal generating unit 11 illustrated in FIG. 8. FIG. 8 is a schematic diagram illustrating, by using a tap that gives a 2$\tau$ delay, the operation that is performed by a tap interval control unit, the coefficient generating unit, and the PD signal generating unit and performed in a case when the bandwidth ratio is 0.5 and when N=4. In other words, this state is the same as that obtained when the delay time between the delay signals is made double. Specifically, the configuration obtained from the operation performed in a case when the bandwidth ratio is 0.5 and when N=4 is the configuration obtained by removing the distortion compensation coefficient generating unit 122 (1), the distortion compensation coefficient generating unit 122(3), the multiplier 112(1), and the multiplier 112(3) from the configuration illustrated in FIG. 7. Furthermore, the configuration obtained from the operation performed in a case when the bandwidth ratio is 0.5 and when N=4 is obtained by arranging a tap 151 between the distortion compensation coefficient generating units 122(0) and 122(2) and by arranging a tap 152 between the distortion compensation coefficient generating units 122(2) and 122(4). Furthermore, the configuration obtained from the operation performed in a case when the bandwidth ratio is 0.5 and when N=4 is obtained by arranging g a tap 153 between the multipliers 112(0) and 112(2) and a tap 154 between the multipliers 112(2) and 112(4).

Because the distortion compensation coefficient generating unit 122(i) outputs 0 as the distortion compensation coefficient in this way, the delay time of the tap in the PD signal generating unit 11 can be changed. Specifically, the delay time between the delay signals can be changed.

The DAC 21 receives an input of the predistortion signal from the adder 113 included in the PD signal generating unit 11. Then, the DAC 21 converts the received predistortion signal from the digital signal to the analog signal. Then, the DAC 21 outputs, to the up-converter 22, the predistortion signal that is converted to the analog signal.

The up-converter 22 receives an input of the predistortion signal from the DAC 21. Then, by using the signal that is input from the oscillator 23, the up-converter 22 performs up-conversion on the received predistortion signal to the carrier frequency. Then, the up-converter 22 outputs the predistortion signal centered at the carrier frequency to the power amplifier 2.

The power amplifier 2 receives an input of the predistortion signal from the up-converter 22. The power amplifier 2 amplifies the received predistortion signal and generates a transmission signal. Then, the transmission signal that is output from the power amplifier 2 is branched into two. One transmission signal is transmitted to an external receiving device via an antenna 24, whereas the other transmission signal is transmitted to the error signal calculating unit 3.

As illustrated in FIG. 1, the error signal calculating unit 3 includes a down-converter 31, an oscillator 32, an ADC 33, the quadrature demodulator (DEM) 34, the PD signal generating unit 35, and the subtracter 36.

The down-converter 31 receives an input of the transmission signal that is output from the power amplifier 2. Then, by using the signal that is input from the oscillator 32, the down-converter 31 performs down-conversion on the received transmission signal by converting the frequency to baseband. Then, the down-converter 31 outputs the down-converted signal to the ADC 33.

The ADC 33 receives an input of the down-converted signal whose frequency is centered at baseband from the down-converter 31. Then, the ADC 33 converts the input signal to the digital signal. Then, the ADC 33 outputs the signal that has been converted to the digital signal to the quadrature demodulator 34.

The quadrature demodulator 34 receives, from the ADC 33, an input of the signal that has been converted to the digital signal. Then, the quadrature demodulator 34 performs the quadrature demodulation on the received signal and generates a feedback signal containing an inphase (I) signal and a quadrature (Q) signal. Then, the quadrature demodulator 34 outputs the feedback signal to the PD signal generating unit 35 and the update arithmetic unit 13.

Although not illustrated in the drawing, the PD signal generating unit 35 has the same configuration as the PD signal generating unit 11. In the first embodiment, the PD signal generating unit 35 includes N taps, N+1 multipliers, and one adder. The PD signal generating unit 35 receives an input of the feedback signal from the quadrature demodulator 34. Then, the PD signal generating unit 35 sequentially gives delays to the received signals by allowing the signals to pass the tap delay line included in the PD signal generating unit 35. Then, the PD signal generating unit 35 branches the signal, which passes each tap and receives a delay from the corresponding tap, and generates N signals. Specifically, these N signals are feedback signals to which $\tau, 2\tau, \ldots, N\tau$ delays are given in an associated manner. Then, the PD signal generating unit 35 inputs, to the corresponding multiplier included in the PD signal generating unit 35, the feedback signal and the feedback signals to each of which a corresponding delay is given. Furthermore, each of the distortion compensation coefficients that is output from the coefficient generating unit 12 is input to each of the multipliers in the PD signal generating unit 35. Then, the PD signal generating unit 35 performs multiplication at each multiplier and inputs each multiplication result to the corresponding adder included in the PD signal generating unit 35. Then, the PD signal generating unit 35 adds the multiplication results using the adder and generates a feedback signal (hereinafter, referred to as a "predistortion signal in feedback (FB) path") that is subjected to the predistortion. Then, the PD signal generating unit 35 outputs the predistortion signal in FB path to the subtracter 36.

The subtracter 36 receives an input of the predistortion signal from the PD signal generating unit 11. Furthermore, the subtracter 36 receives an input of the predistortion signal in FB path from the PD signal generating unit 35. Then, the subtracter 36 calculates the difference between the predistortion signal and the predistortion signal in FB path and generates an error signal. Then, the subtracter 36 outputs the generated error signal to the update arithmetic unit 13.

In FIG. 1, the power amplifier 2, the up-converter 22, the oscillator 23, the down-converter 31, and the oscillator 32 are included in a radio frequency (RF) unit and are implemented by an analog circuit. Furthermore, the baseband signal generating unit 50, the carrier generating unit 51, the distortion compensation unit 1, the tap interval control unit 4, the quadrature demodulator 34, the PD signal generating unit 35, and the subtracter 36 are included in the baseband (BB) unit and are implemented by a DSP, a CPU, a memory, or the like.

Figure 9:
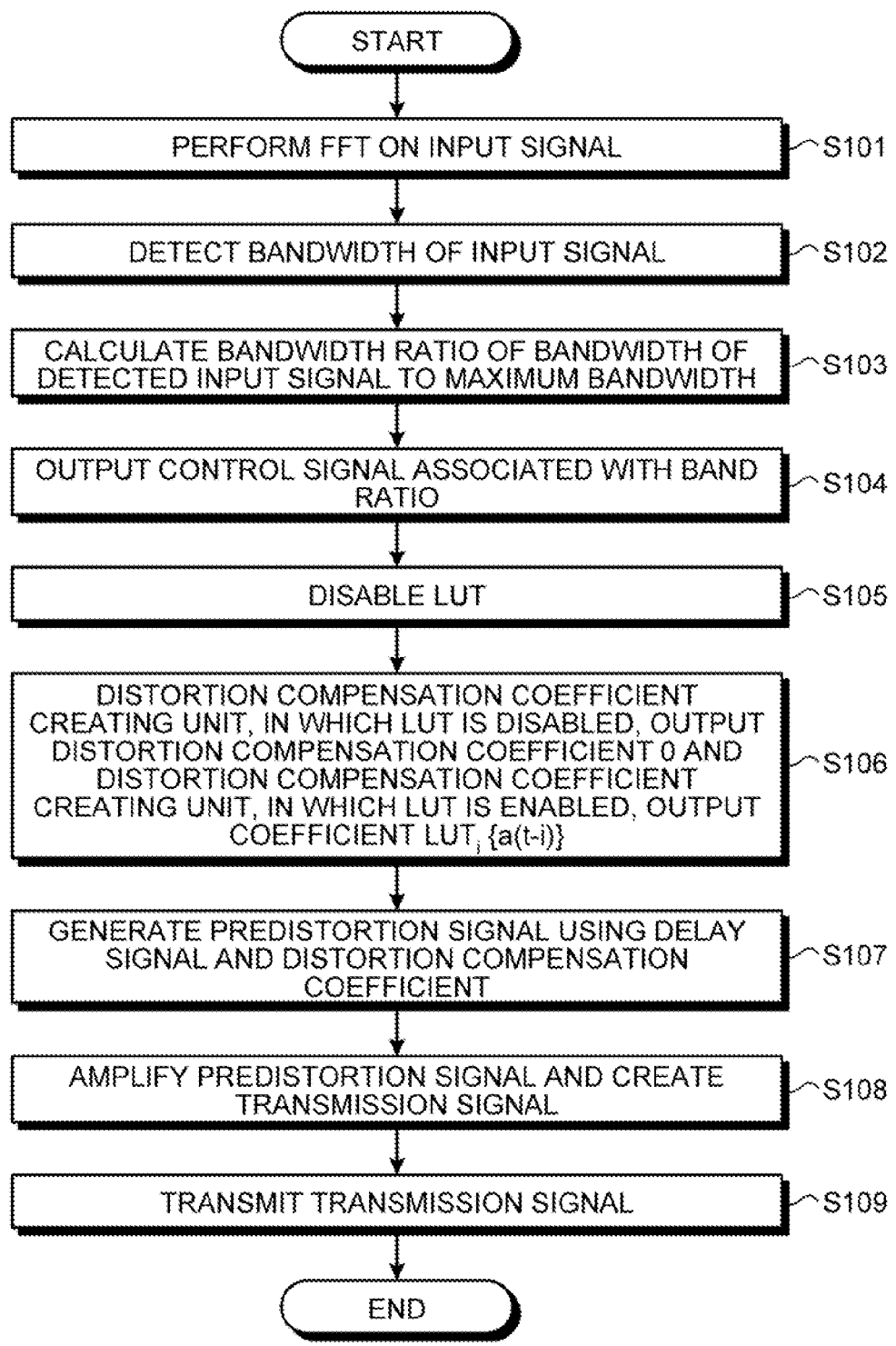
FIG. 9 is a flowchart of a signal transmission process performed by the transmitter according to the first embodiment.

In the following, a signal transmission process performed by a transmitter according to the first embodiment will be described with reference to FIG. 9. FIG. 9 is a flowchart of a signal transmission process performed by the transmitter according to the first embodiment. In this embodiment, a process for calculating a new distortion compensation coefficient that is used to update the distortion compensation coefficient is not described.

The FFT unit 411 in the signal characteristic detecting unit 41 performs the fast Fourier transform (FFT) on the input signal that is input from the carrier generating unit 51 and converts the time domain transmission signal to the frequency domain transmission signal (Step S101).

The bandwidth detecting unit 412 in the signal characteristic detecting unit 41 receives, from the FFT unit 411, spectrum information that is the amplitude characteristic of the input signal converted to the frequency domain. Then, the bandwidth detecting unit 412 detects, from the spectrum information, the bandwidth occupied by the input signal (Step S102).

Then, the bandwidth detecting unit 412 calculates the bandwidth ratio of the bandwidth of the detected input signal to the maximum bandwidth (Step S103). Then, the bandwidth detecting unit 412 outputs the calculated bandwidth ratio to the control signal generating unit 42.

The control signal generating unit 42 receives an input of the bandwidth ratio from the bandwidth detecting unit 412. Then, the control signal generating unit 42 obtains, from the bandwidth ratio and the control signal setting that are stored in an associated manner, the control signal setting that is associated with the input bandwidth ratio. Then, the control signal generating unit 42 outputs, to the coefficient generating unit 12, the control signal associated with the bandwidth ratio (Step S104).

The distortion compensation coefficient generating unit 122, which receives the control signal that disables the LUT from the control signal generating unit 42, disables the LUT included in the corresponding distortion compensation coefficient generating unit 122 (Step S105).

The distortion compensation coefficient generating unit 122, in which the LUT is disabled, outputs 0 as the distortion compensation coefficient to the multiplier 112 in the PD signal generating unit 11. In contrast, the distortion compensation coefficient generating unit 122($i$), in which the LUT is still enabled, outputs the distortion compensation coefficient $LUT_i$ {a(t–i)} to the multiplier 112($i$) in the PD signal generating unit 11 (Step S106).

By using the multiplier 112, the PD signal generating unit 11 multiplies a delay signal by a distortion compensation coefficient that is input from the distortion compensation coefficient generating unit 122. At this time, if the input distortion compensation coefficient is 0, the multiplier 112 outputs 0 as a multiplication result. Accordingly, the delay signal that contains 0 as the distortion compensation coefficient and that is input to the multiplier is not used to generate the predistortion signal. Then, by using the adder 113, the PD signal generating unit 11 adds the multiplication results that are output from each of the multipliers 112 and generates a predistortion signal (Step S107). Thereafter, the PD signal generating unit 11 outputs the generated predistortion signal.

The predistortion signal is converted to the analog signal in the DAC 21, is converted to the RF signal by the up-converter 22 and the oscillator 23, and is input to the power amplifier 2. The power amplifier 2 amplifies the input predistortion signal and generates a transmission signal (Step S108).

Then, the power amplifier 2 transmits the generated transmission signal to the external unit via the antenna 24 (Step S109).

As described above, with the amplifier according to the first embodiment, if the bandwidth occupied by the input signal is narrow, the signal correlation between the adjacent data sample points is high; therefore, delay signals are thinned out to make the delay interval long. Accordingly, even if the signal correlation between the adjacent data sample points is high, the update of the coefficients can be correctly obtained using a convergent algorithm in accordance with the steepest-descent method, thus converging the distortion compensation coefficients to their optimum values. Accordingly, even if the signal correlation between the adjacent data sample points is high, it is possible to suppress the degradation of the distortion compensation.

Modification

Figure 10:
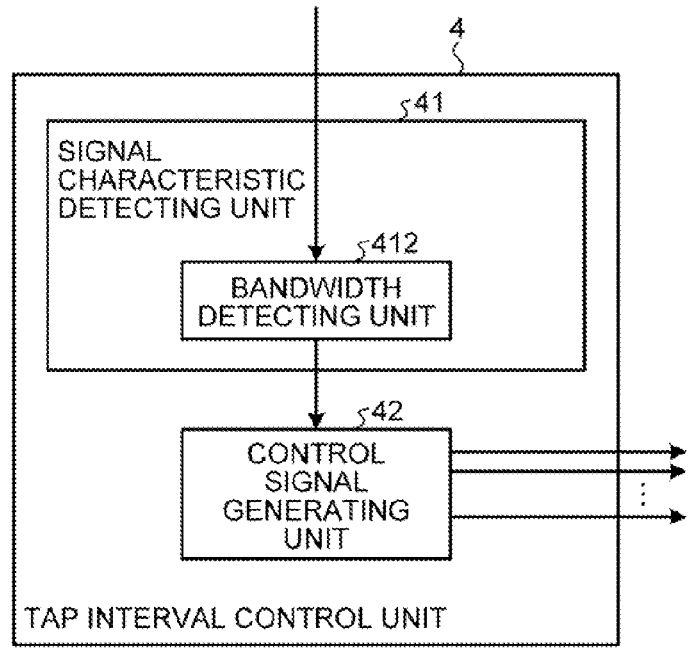
FIG. 10 is a block diagram illustrating a tap interval control unit in a transmission according to a modification of the first embodiment.

In the following, a modification of the amplifier according to the first embodiment will be described. The modification differs from the first embodiment in that the detecting of the bandwidth is obtained from carrier setting information. FIG. 10 is a block diagram illustrating a tap interval control unit in an amplifier according to a modification of the first embodiment.

As illustrated in FIG. 10, the signal characteristic detecting unit 41 in the tap interval control unit 4 according to the first embodiment does not need to include the FFT unit 411 as long as it includes the bandwidth detecting unit 412.

The carrier generating unit 51 receives an input of the carrier setting information. The carrier setting information contains, for example, the frequency shift setting and the carrier bandwidth of each carrier that is used. Then, the carrier generating unit 51 outputs the carrier setting information to the signal characteristic detecting unit 41 in the tap interval control unit 4.

The signal characteristic detecting unit 41 receives an input of the carrier setting information from the carrier generating unit 51. Then, the bandwidth detecting unit 412 in the signal characteristic detecting unit 41 specifies, from the received carrier setting information, each carrier that is used to the transmission. The bandwidth detecting unit 412 calculates, from the frequency shift setting and the carrier bandwidth of each specified carrier, the bandwidth as the multi carrier signal. Then, the bandwidth detecting unit 412 outputs the calculated bandwidth to the control signal generating unit 42.

In the similar manner as in the first embodiment, by using the bandwidth the control signal generating unit 42 generates a control signal for the LUT stored in the distortion compensation coefficient generating unit 122 and outputs the control signal to the distortion compensation coefficient generating unit 122. By doing so, it is possible to adjust the delay time between the delay signals.

Figure 11:
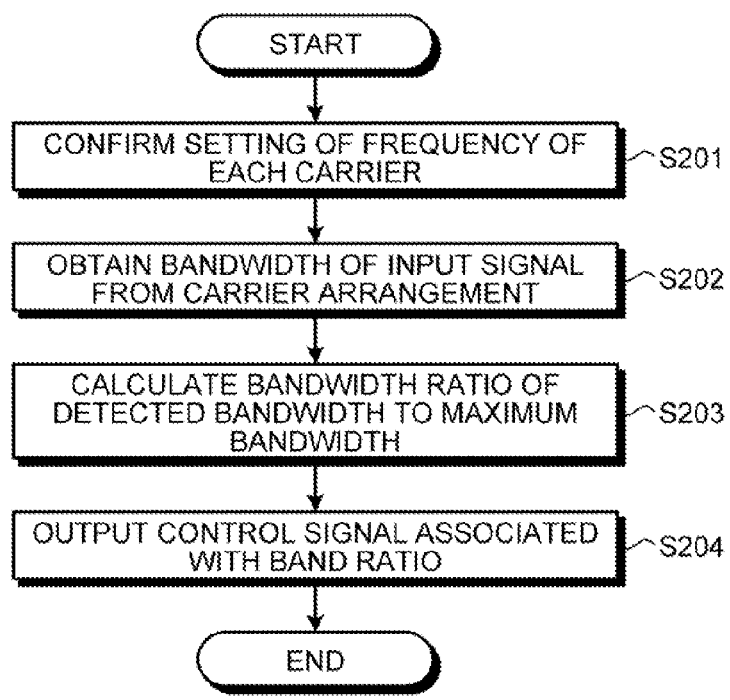
FIG. 11 is a flowchart illustrating a signal transmission process performed by a transmitter according to the modification of the first embodiment.

In the following, a signal transmission process performed by the transmitter according to the first modification will be described with reference to FIG. 11. FIG. 11 is a flowchart illustrating a signal transmission process performed by a transmitter according to the modification of the first embodiment. In FIG. 11, the processes that are performed by the control signal generating unit 42 and that are performed after outputting the control signal are the same as those in the first embodiment; therefore, only the processes up to outputting of the control signal performed by the control signal generating unit 42 will be described.

The bandwidth detecting unit 412 confirms the setting of the frequency of each carrier in accordance with the carrier setting information that is input from the carrier generating unit 51 (Step S201).

The bandwidth detecting unit 412 obtains the bandwidth of the input signal in accordance with the carrier arrangement, such as the frequency shift setting and the carrier bandwidth (Step S202).

Then, the bandwidth detecting unit 412 calculates the bandwidth ratio of the bandwidth of the detected input signal to the maximum bandwidth (Step S203). Then, the bandwidth detecting unit 412 outputs the calculated bandwidth ratio to the control signal generating unit 42.

The control signal generating unit 42 receives an input of the bandwidth ratio from the bandwidth detecting unit 412. Then, the control signal generating unit 42 obtains, from the bandwidth ratio and the control signal setting that are stored in an associated manner, the control signal setting associated with the input bandwidth ratio. Then, the control signal generating unit 42 outputs the control signal associated with the bandwidth ratio to the coefficient generating unit 12 (Step S204).

As described above, with the amplifier according to the modification of the first embodiment, because the bandwidth is obtained using the input carrier setting information, it is possible to eliminate the process, such as the FFT process performed on the input signal, thus reducing the processing loads on the transmitter.

[b] Second Embodiment

A second embodiment differs from the first embodiment in that, when measuring the bandwidth, the band, which is occupied by the carriers in which the difference in power between the carrier and the carrier having the maximum power is within a predetermined threshold, is used as the bandwidth of the input signal. Accordingly, in the following, the detecting of the bandwidth will mainly be described. A block diagram of a transmitter according to the second embodiment can also be represented by FIG. 1. Furthermore, a block diagram of a tap interval control unit according to the second embodiment can also be represented by FIG. 4. Components of the transmitter according to the second embodiment having the same reference numerals as those described in the first embodiment have the same configuration as those in the first embodiment unless otherwise noted.

Figure 12:
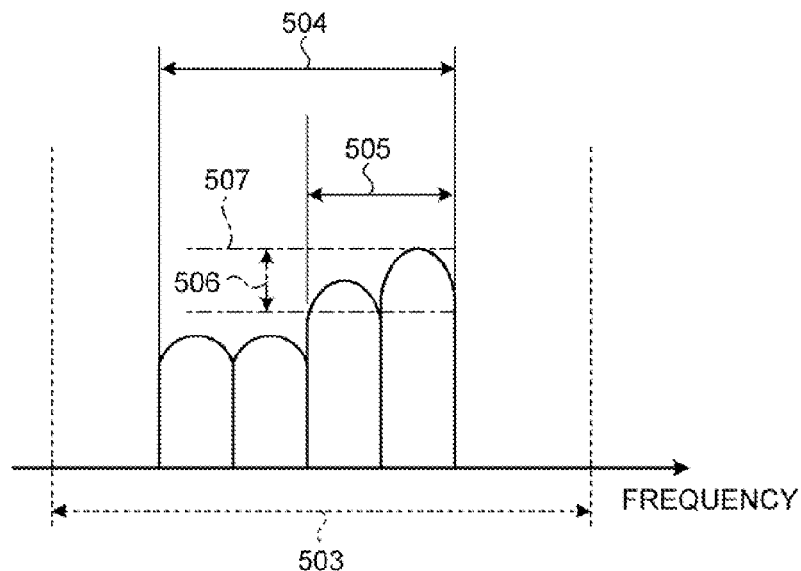
FIG. 12 is a schematic diagram illustrating the detecting of bandwidth according the second embodiment.

The detecting of the bandwidth performed by the bandwidth detecting unit 412 according to the second embodiment will be described with reference to FIG. 12. FIG. 12 is a schematic diagram illustrating the detecting of a bandwidth according a second embodiment. In FIG. 12, the horizontal axis indicates the frequency and the vertical axis indicates the amplitude of the signal spectrum. FIG. 12 illustrates a case in which four carriers are set as the transmission signal. In FIG. 12, the maximum bandwidth of the input signal is represented by a maximum bandwidth 503. Furthermore, a bandwidth 504 is the bandwidth that is occupied by the input signal.

In the second embodiment, the bandwidth detecting unit 412 stores therein a threshold of the difference in amplitude as TH. The bandwidth detecting unit 412 receives an input of the spectrum information from the FFT unit 411. Then, as illustrated in FIG. 12, the bandwidth detecting unit 412 detects, from the spectrum information, an amplitude level (hereinafter, referred to as "the maximum amplitude level") 507 of the carrier that is transmitted at the maximum power. Then, the bandwidth detecting unit 412 detects, as the bandwidth of the input signal, the frequency band occupied by the carrier having an amplitude in which the difference obtained from the maximum amplitude level 507 is within TH. In FIG. 12, an amplitude difference 506 corresponds to the difference between the amplitude of the maximum amplitude level 507 and the amplitude in which the difference obtained from the maximum amplitude level 507 is TH. The bandwidth detecting unit 412 removes, from the measurement of the frequency band of the input signal, a frequency band of a carrier in which the difference obtained from the maximum amplitude level 507 becomes greater than the amplitude difference 506. Accordingly, as illustrated in FIG. 12, the bandwidth detecting unit 412 detects, as the bandwidth of the input signal, a bandwidth 505 in which the difference in amplitude between the carriers in the band and the carrier having the maximum amplitude level 507 is within TH. As illustrated in FIG. 12, the detected bandwidth 505 is narrower than the bandwidth that is actually occupied by the input signal. Specifically, when detecting the bandwidth by the bandwidth detecting unit 412 according to the second embodiment, even if the same input signal as that detected in the first embodiment is detected, it is determined that the signal correlation between the adjacent data samples is high compared with a case of the first embodiment. The bandwidth detecting unit 412 outputs information on the detected bandwidth to the control signal generating unit 42.

Figure 13:
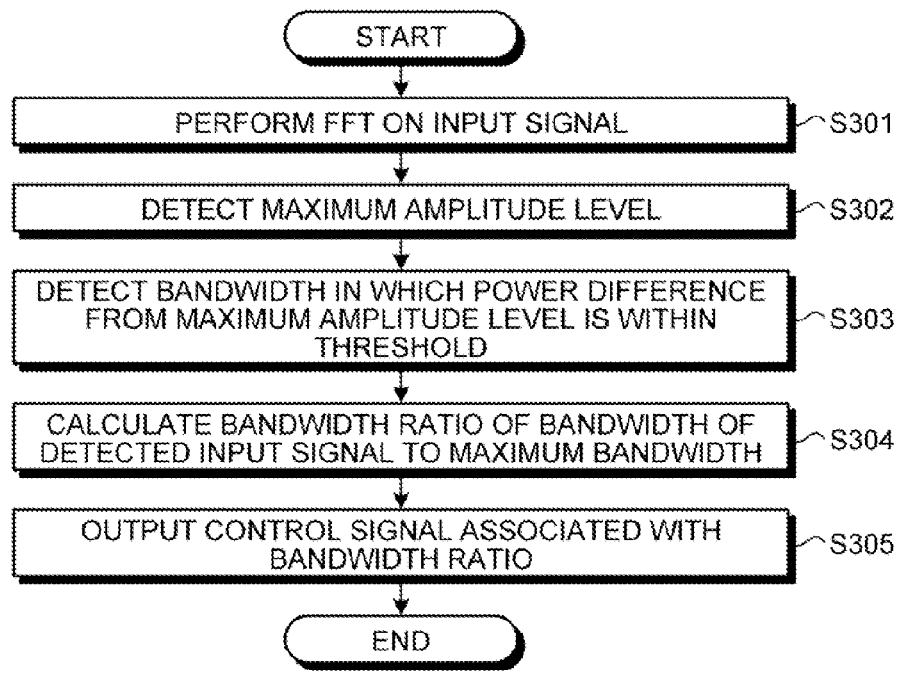
FIG. 13 is a flowchart illustrating a signal transmission process performed by a transmitter according to the second embodiment.

In the following, a signal transmission process performed by the transmitter according to the second modification will be described with reference to FIG. 13. FIG. 13 is a flowchart illustrating a signal transmission process performed by a transmitter according to the second embodiment. In FIG. 13, the processes that are performed by the control signal generating unit 42 and that are performed after outputting the control signal are the same as those in the first embodiment; therefore, only the processes up to the output of the control signal performed by the control signal generating unit 42 will be described.

The FFT unit 411 in the signal characteristic detecting unit 41 performs the fast Fourier transform (FFT) on the input signal that is input from the carrier generating unit 51 and converts the time domain transmission signal to the frequency domain transmission signal (Step S301).

The bandwidth detecting unit 412 in the signal characteristic detecting unit 41 receives, from the FFT unit 411, the spectrum information on the amplitude characteristic of the input signal in frequency domain. Then, the bandwidth detecting unit 412 detects the maximum amplitude level from the spectrum information (Step S302).

Then, the bandwidth detecting unit 412 detects the bandwidth in which the power difference obtained from the maximum amplitude level is within the threshold (Step S303).

Then, the bandwidth detecting unit 412 calculates the bandwidth ratio of the bandwidth of the detected input signal to the maximum bandwidth (Step S304). The bandwidth detecting unit 412 outputs the calculated bandwidth ratio to the control signal generating unit 42.

The control signal generating unit 42 receives an input of the bandwidth ratio from the bandwidth detecting unit 412. Then, the control signal generating unit 42 obtains, from the bandwidth ratio and the control signal setting that are stored in an associated manner, the control signal setting associated with the input bandwidth ratio. Then, the control signal generating unit 42 outputs the control signal associated with the bandwidth ratio to the coefficient generating unit 12 (Step S305).

As described above, the amplifier according to the second embodiment determines, as the bandwidth of the received input signal, the frequency band in which the power difference between a carrier and a carrier that is transmitted at the maximum power is within a predetermined value. The carrier whose power is closer to that of the carrier with the maximum amplitude level dominantly exert an influence on the amplification of the input signal. Accordingly, when taking into consideration the amplification of the input signal, by using the frequency band having the amplitude closer to the maximum amplitude level as the bandwidth of the input signal, it is possible to appropriately determine the signal correlation between the adjacent data samples. This makes it possible to more appropriately determine that the signal correlation between the adjacent samples is high, thus appropriately reducing the degradation of the distortion compensation.

[c] Third Embodiment

An amplifier according to a third embodiment differs from the first embodiment in that the correlation is obtained using an arithmetic expression. Accordingly, in the following, a method for obtaining the correlation using the arithmetic expression will mainly be described. A block diagram of a transmitter according to the third embodiment can also be represented by FIG. 1. Components of the transmitter according to the third embodiment having the same reference numerals as those described in the first embodiment have the same configuration as those in the first embodiment unless otherwise noted.

Figure 14:
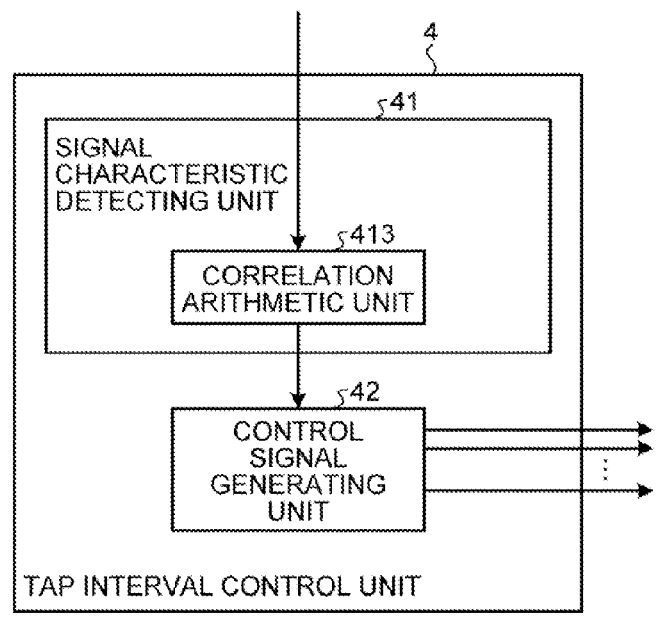
FIG. 14 is a block diagram illustrating a tap interval control unit in a transmitter according to the third embodiment.

FIG. 14 is a block diagram illustrating a tap interval control unit in a transmitter according to a third embodiment. As illustrated in FIG. 14, the signal characteristic detecting unit 41 in the tap interval control unit 4 according to the third embodiment includes a correlation arithmetic unit 413.

The correlation arithmetic unit 413 stores therein Equation that is used to obtain the correlation between the adjacent data sample points of the input signal. In the third embodiment, the correlation arithmetic unit 413 stores therein Equation (3) below that is used to obtain a normalized value by multiplying transmission signal $x(t)$ at the current time by the complex conjugate of the transmission signal $x(t-D)$ obtained D clock before the current time, by integrating the multiplication result in a certain interval, and by dividing the integration result by a value of the transmission signal power in the same interval. In Equation (3), M samples are used for the certain interval. Here, the correlation power ratio is represented by $P_{corr}(D)$ $$P_{corr}(D) = \left| \frac{\sum_{t=0}^{M-1} x(t) \times x(t-D)^*}{\sum_{t=0}^{M-1} |x(t)|^2} \right|  \quad (3)$$

Figure 15:
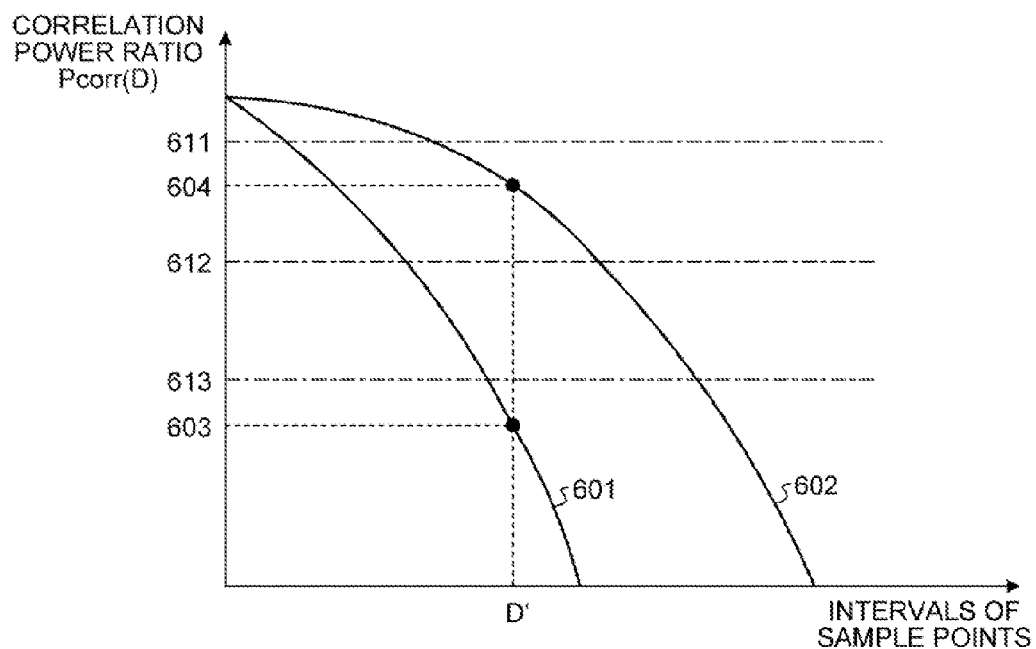
FIG. 15 is a schematic diagram illustrating an example of the relationship between the intervals of data sample points and a correlation power ratio Pcorr(D)

FIG. 15 is a schematic diagram illustrating an example of the relationship between the intervals of data sample points and a correlation power ratio $P_{corr}(D)$. In FIG. 15, the vertical axis indicates the correlation power ratio and the horizontal axis indicates the interval of the data sample point. The difference of the correlation between the adjacent data sample points in a case in which the bandwidth of an input signal is W and in a case in which the bandwidth of an input signal is W/2 will be described with reference to FIG. 15. A graph 601 indicates the relationship between correlation power ratio $P_{corr}(D)$ and the interval of the data sample point obtained in a case in which the bandwidth is W. A graph 602 indicates the relationship between the correlation power ratio $P_{corr}(D)$ and the interval of the data sample point obtained in a case in which the band is W/2. In such a case, a correlation power ratio 603 represents the ratio obtained in a case in which the bandwidth at the intervals of D' data sample points is W. A correlation power ratio 604 represents the correlation power ratio obtained in a case in which the bandwidth at the intervals of D' sample points is W/2. In the third embodiment, it is assumed that the correlation arithmetic unit 413 obtains the correlation between the adjacent data sample points using the correlation power ratio that is obtained in a case in which the interval of the sample points corresponds to the intervals of D' sample points. Here, the interval D of the data sample point used to obtain the correlation is preferably a value from which the difference of the correlation power ratio in each of the bandwidths is clearly determined. For example, if the interval D is too short, there is no difference between the bandwidths. Furthermore, if the interval D is too long, there may be a case in which the bandwidth from which the correlation power ratio is not obtained.

In the third embodiment, the correlation arithmetic unit 413 stores a threshold 611, a threshold 612, and a threshold 613, which are illustrated in FIG. 15. Then, the correlation arithmetic unit 413 obtains the relationship between the calculated correlation power ratio and the thresholds. For example, if the bandwidth of the input signal is W, the correlation arithmetic unit 413 illustrated in FIG. 15 obtains the correlation power ratio $P_{corr}(D')$ as the correlation power ratio 603. Then, the correlation arithmetic unit 413 determines that the value 603 is smaller than the threshold 613. Furthermore, if the bandwidth of the input signal is W/2, the correlation arithmetic unit 413 obtains the correlation power ratio $P_{corr}(D')$ as the correlation power ratio 604. Then, the correlation arithmetic unit 413 determines that the correlation power ratio 604 is equal to or greater than the threshold 612 and is smaller than the threshold 611.

Then, the correlation arithmetic unit 413 outputs the obtained relationship between the correlation power ratio and the thresholds to the control signal generating unit 42.

Figures 16, 17:
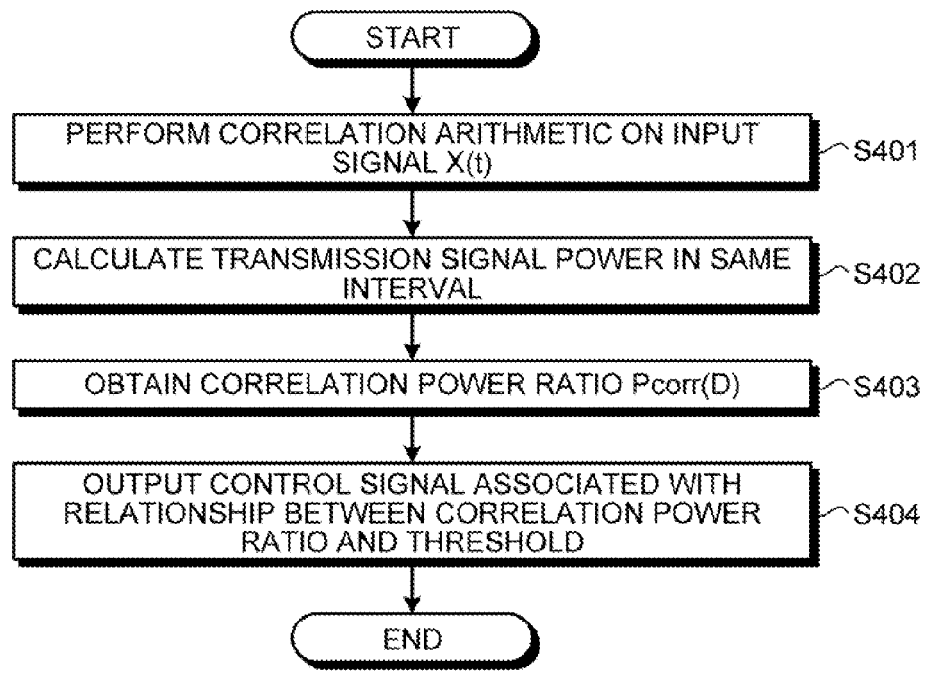
FIG. 16 is a table of a control signal setting generated when N=4 clock delay if the correlation is obtained by using an arithmetic expression.
FIG. 17 is a flowchart illustrating a signal transmission process performed by a transmitter according to the third embodiment.

FIG. 16 is a table of a control signal setting generated when N=4 clock delay if the correlation is obtained by using an arithmetic expression. The control signal generating unit 42 stores therein the relationship between the thresholds and the correlation power ratio illustrated in FIG. 16 and also stores therein control signals associated with LUTs.

The control signal generating unit 42 receives an input of the relationship between the correlation power ratio and the thresholds of the input signals from the correlation arithmetic unit 413. Then, by using the relationship between the thresholds and the correlation power ratio and by using the control signals with respect to the LUTs, which are all stored in an associated manner, the control signal generating unit 42 obtains the setting of the control signal associated with the relationship between the input correlation power ratio and the thresholds.

For example, when receiving, from the correlation arithmetic unit 413, the relationship indicating that, if the bandwidth of the input signal is W, the correlation power ratio is smaller than the threshold 613, the control signal generating unit 42 obtains the setting associated with the relationship that satisfies the threshold 613>Pcorr(D). Specifically, as illustrated in a row 703 in the item of the control signal, the control signal generating unit 42 obtains the setting of the control signal that enables all of the $LUT_0$ to $LUT_4$. Furthermore, when receiving, from the correlation arithmetic unit 413, the relationship indicating that, if the bandwidth of the input signal is W/2, the correlation power ratio is equal to or greater than the threshold 612 and is smaller than the threshold 611, the control signal generating unit 42 obtains the setting associated with the relationship that satisfies the threshold 611>Pcorr(D)≧threshold 612. Specifically, as illustrated in a row 704 in the item of the control signal, the control signal generating unit 42 obtains the setting of the control signal that enables the $LUT_0$, the $LUT_2$, and the $LUT_4$ and the control signal that disables the $LUT_E$ and the $LUT_3$.

In FIG. 16, if the correlation power ratio is high, the signal correlation between the adjacent data samples also high. Furthermore, as illustrated in FIG. 15, if the bandwidth of the signal is W/2, the correlation power ratio between the adjacent data samples is higher than in a case in which the bandwidth of the signal is W. Specifically, the relationship illustrated in FIG. 16 in an associated manner indicates that, if the bandwidth becomes narrow, the correlation between the data sample points becomes high. This conforms to the state in which, if the bandwidth is narrow, the signal correlation between the adjacent data samples is high.

Then, the control signal generating unit 42 outputs the obtained setting of the control signal to each distortion compensation coefficient generating unit 122.

In the following, a signal transmission process performed by a transmitter according to a modification of the third embodiment will be described with reference to FIG. 17. FIG. 17 is a flowchart illustrating a signal transmission process performed by a transmitter according to the third embodiment. In FIG. 17, the processes that are performed by the control signal generating unit 42 and that are performed after outputting the control signal are the same as those in the first embodiment; therefore, only the processes up to the output of the control signal performed by the control signal generating unit 42 will be described.

The correlation arithmetic unit 413 in the signal characteristic detecting unit 41 performs the correlation arithmetic on the input signal x(t) that is input from the carrier generating unit 51 (Step S401). This correlation arithmetic corresponds to the numerator in Equation (3).

Furthermore, the correlation arithmetic unit 413 calculates the transmission signal power in the same interval (Step S402). The transmission signal power in the same interval corresponds to the denominator in Equation (3).

Then, by using the result of the correlation arithmetic and the transmission signal power in the same interval, the correlation arithmetic unit 413 obtains the correlation power ratio Pcorr(D) (Step S403). Then, the correlation arithmetic unit 413 outputs, to the control signal generating unit 42, the relationship between the obtained correlation power ratio and the thresholds that are stored in advance therein.

The control signal generating unit 42 receives an input of the relationship between the correlation power ratio and the thresholds from the bandwidth detecting unit 412. Then, the control signal generating unit 42 obtains, from control signal setting associated with the relationship between the stored correlation power ratio and the thresholds, the control signal setting that is associated with the relationship between the input correlation power ratio and the thresholds. Then, the control signal generating unit 42 outputs, to the coefficient generating unit 12, the control signal that is associated with the relationship between the correlation power ratio and the thresholds (Step S404).

As described above, the amplifier according to the third embodiment obtains the correlation using the arithmetic expression and controls the delay interval of the delay signals by using the obtained correlation. Accordingly, by adjusting an equation that is used to obtain the correlation, it is possible to control appropriate delay intervals, thus easily controlling the delay intervals in accordance with the characteristics of the amplifier.

[d] Fourth Embodiment

In the following, an amplifier according to a fourth embodiment will be described. The amplifier according to the fourth embodiment differs from the first, second, and third embodiments in that the generating of a distortion compensation coefficient is implemented by an exponential cubic polynomial. In the following, the generating of the distortion compensation coefficient will mainly be described. A block diagram of a transmitter according to the fourth embodiment can also be represented by FIG. 1. Components of the transmitter according to the fourth embodiment having the same reference numerals as those described in the first embodiment have the same configuration as those in the first embodiment unless otherwise noted.

Figure 18:
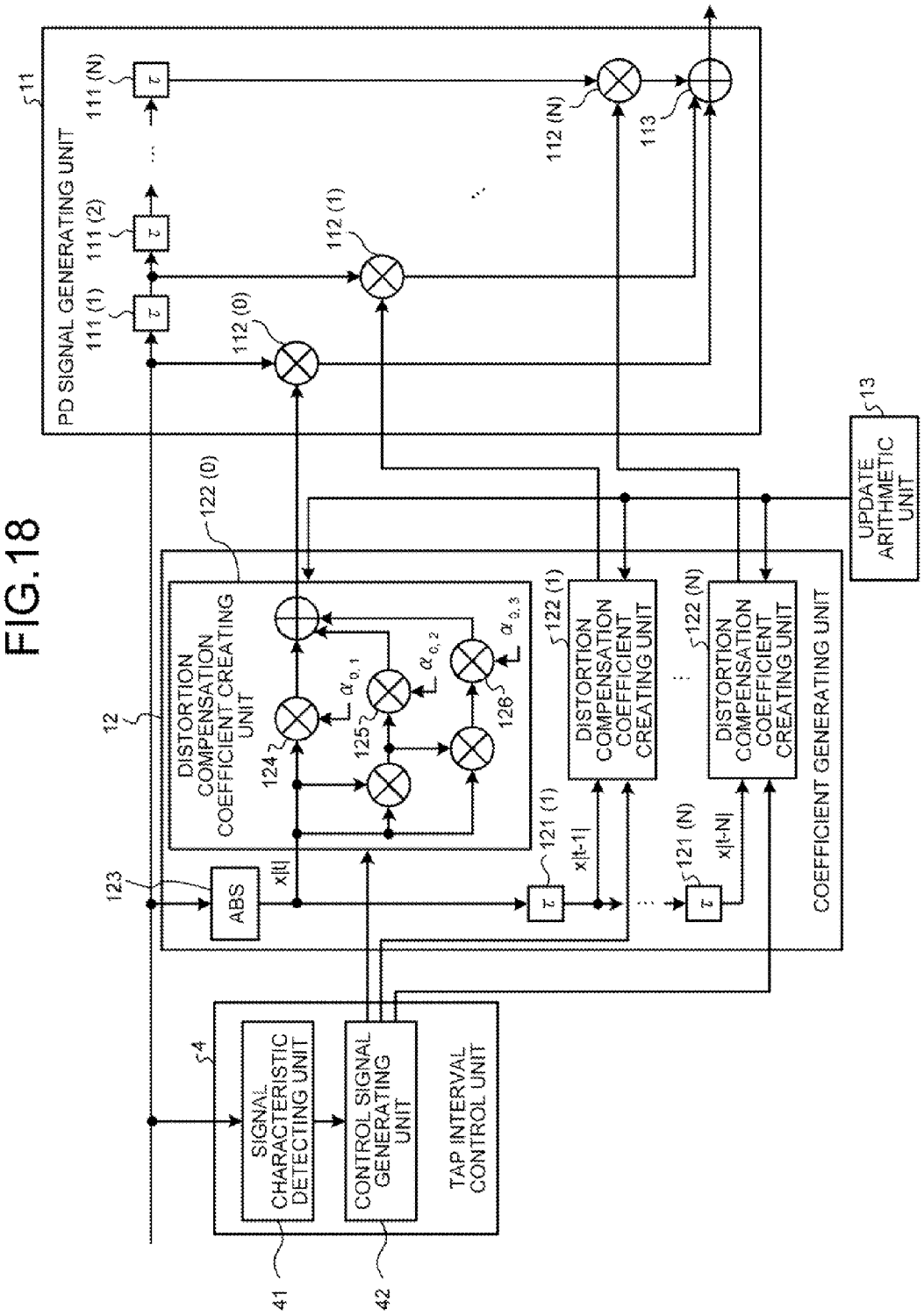
FIG. 18 is a block diagram illustrating, in detail, a distortion compensation unit according to the fourth embodiment.

FIG. 18 is a block diagram illustrating, in detail, a distortion compensation unit according to a fourth embodiment. The coefficient generating unit 12 according to the fourth embodiment includes the tap 121, the distortion compensation coefficient generating unit 122, and an ABS 123.

The ABS 123 receives an input signal from the carrier generating unit 51. Then, the ABS 123 obtains an absolute value of the input signal. Then, the ABS 123 outputs the absolute value of the input signal to the distortion compensation coefficient generating unit 122(0) and the tap 121(1).

The signal that is output from the ABS 123 passes each tap 121. Then, the signal passing the tap (j) (j=1, 2, . . . N) is branched off and is supplied to the distortion compensation coefficient generating unit 122(j).

As illustrated in FIG. 18, the distortion compensation coefficient generating unit 122 according to the fourth embodiment is implemented by, for example, a third-order cubic power series polynomial. Here, FIG. 18 illustrates, in detail as an example, the configuration of the distortion compensation coefficient generating unit 122(0); however, the distortion compensation coefficient generating units 122(1) to 122(N) also have the same configuration as that of the distortion compensation coefficient generating unit 122(0) and operate in the same manner as the distortion compensation coefficient generating unit 122(0). The distortion compensation coefficient generating unit 122(i) receives, from the update arithmetic unit 13, an input of $\alpha_{i,k}$ (i=0, 1, ..., and N; whereas k=1, 2, and 3). The symbol of $\alpha_{i,k}$ represents a k-th order coefficient of the power series polynomial performed by the distortion compensation coefficient generating unit 122(i). For example, a multiplier 124 in the distortion compensation coefficient generating unit 122(0) receives an input of $\alpha_{0,1}$ from the update arithmetic unit 13. Furthermore, a multiplier 125 receives an input of $\alpha_{0,2}$ from the update arithmetic unit 13. Furthermore, a multiplier 126 receives an input of $\alpha_{0,3}$ from the update arithmetic unit 13.

Then, the distortion compensation coefficient generating unit 122(i) outputs, as a distortion compensation coefficient to the multiplier 112(i) in the PD signal generating unit 11, the calculation result of the k-th order power series polynomial $G_i$ represented by Equation (4) below, which indicates an power series polynomial of the amplitude of the input signal delayed by i clock.

$$G_i(|x(t-i)|) = \sum_{k=1}^{K} \alpha_{i,k} \times |x(t-i)|^k \quad (4)$$

If the control signal that disables the power series arithmetic is input from the control signal generating unit 42, the distortion compensation coefficient generating unit 122 outputs 0 as the distortion compensation coefficient.

The update arithmetic unit 13 obtains $\alpha_{i,k}$ (i=0, 1, ..., and N; whereas k=1, 2, and 3) that is supplied to each distortion compensation coefficient generating unit 122 so as to minimize the power of the error signal. Then, the update arithmetic unit 13 supplies the obtained $\alpha_{i,k}$ to the distortion compensation coefficient generating unit 122.

As described above, the amplifier according to the fourth embodiment can calculate a distortion compensation coefficient using a power series polynomial.

Furthermore, in the embodiments described above, in order to more effectively perform the predistortion, a description has been given by using the power amplification device that includes the predistortion signal generating unit in the forward path and the predistortion signal generating unit in the feedback path. However, another configuration may also be used in the embodiments described above as long as the power amplification device that generates the predistortion signal is arranged. For example, an error signal may also be generated by directly comparing the input signal and the feedback signal.

According to an aspect of the power amplification device, the transmitter, and the power amplification control method disclosed in the present invention, even when the correlation between adjacent data sample points of the input signals is high, an advantage is provided in that an appropriate distortion compensation can be performed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An power amplification device comprising:
an amplifying unit that amplifies an input signal;
an error signal calculating unit that calculates an error signal in accordance with an output from the amplifying unit and the input signal;
a delay time control unit that controls, in accordance with correlation information on the input signal, intervals of delay signals which are obtained by giving different amounts of delay to the input signal; and
a distortion compensation unit that performs predistortion on the input signal by using distortion compensation coefficients and that outputs the input signal subjected to the predistortion to the amplifying unit, the distortion compensation coefficients being generated in accordance with delay signals whose intervals are controlled by the delay time control unit and the error signal.

2. The power amplification device according to claim 1, wherein the delay time control unit controls the intervals of the delay signals by thinning out the delay signals.

3. The power amplification device according to claim 1, wherein
the delay time control unit includes
a signal characteristic detecting unit that detects a signal characteristic of the input signal, and
a control signal generating unit that determines a signal correlation by using the detected signal characteristic and that, when the signal correlation is higher than a correlation threshold, generates a control signal that controls the intervals of the delay signals that are used for the predistortion, so as to make the intervals longer.

4. The power amplification device according to claim 3, wherein
the signal characteristic detecting unit detects a bandwidth of the input signal, and
when the detected bandwidth is narrower than a bandwidth threshold, the control signal generating unit determines that the signal correlation is higher than the correlation threshold.

5. The power amplification device according to claim 4, wherein the signal characteristic detecting unit detects, as a bandwidth of the input signal, a frequency band containing carriers in which, in the input signal, a power difference between the carriers and the carrier of the maximum power is within a threshold.

6. The power amplification device according to claim 5, wherein the signal characteristic detecting unit stores in advance therein an arithmetic expression that calculates the signal correlation and detects the signal characteristic by using the arithmetic expression performed on the input signal.

7. The power amplification device according to claim 1, wherein
the distortion compensation unit includes
distortion compensation coefficient generating units that are provided in the same number as the number of the delay signals such that the distortion compensation coefficient generating units are associated with the delay signals and that generate, in accordance with the delay signals and the error signal, the distortion compensation coefficients associated with the delay signals, and
a signal generating unit that generates a signal to which the distortion compensation is added by multiplying each of the delay signals by each of the distortion compensation coefficients associated with the delay signals, by adding each multiplication result, and by performing the distortion compensation, and
by setting a distortion compensation coefficient generated by a specific distortion compensation coefficient generating unit to zero, the delay time control unit thins out the delay signals that are used to the distortion compensation.

8. The power amplification device according to claim 7, wherein the delay time control unit stores in advance therein an associated relationship of the correlation of the input signals and the distortion compensation coefficient generating units that are to be disabled, and determines the specific distortion compensation coefficient generating unit in accordance with the associated relation that is stored.

9. The power amplification device according to claim 1, wherein
the distortion compensation unit includes a delay unit that includes a plurality of taps, which is arranged in series and gives a predetermined delay, that sequentially gives the delay by allowing the input signal to sequentially pass the taps, and that obtains, as a delay signal, each signal to which each delay is given at each of the taps, and
the delay time control unit controls the intervals of the delay signals by not using a delay signal that is output from a specific tap for the distortion compensation.

10. The power amplification device according to claim 1, wherein
the distortion compensation unit includes
an update calculating unit that calculates, as update information on the distortion compensation coefficients, a coefficient that minimizes the power of the error signal, and
distortion compensation coefficient generating units that generate the distortion compensation coefficients associated with the delay signals in accordance with the delay signals and the update information on the distortion compensation coefficients.

11. A transmitter comprising:
a baseband signal generating unit that generates a baseband signal;
an RF signal generating circuit that converts the baseband signal to an RF signal;
an amplifier that amplifies the RF signal and outputs the RF signal via an antenna; and
a processor configured to:
calculate an error signal in accordance with the baseband signal and an output from the amplifier;
control, in accordance with correlation information on the input signal, intervals of the delay signals which are obtained by giving different amounts of delay to the input signal; and
perform predistortion on the baseband signal by using distortion compensation coefficients and that outputs the input signal subjected to the predistortion to the RF signal generating unit, the distortion compensation coefficients being generated in accordance with delay signals whose intervals are controlled and the error signals.

12. A power amplification control method comprising:
calculating an error signal in accordance with a first input signal, which is input to an amplifier, and an output signal, which is associated with the first input signal and is output from the amplifier;

obtaining delay signals by giving different amounts of delay to a second input signal;

controlling, in accordance with correlation information on a second input signal, intervals of obtained delay signals;

performing predistortion on the second input signal by using distortion compensation coefficients that are generated in accordance with the delay signals whose intervals are controlled and the error signal; and amplifying, using the amplifier, the second input signal that performs the predistortion.

13. A power amplification device comprising:

an amplifying unit that amplifies an input signal; a processor; and a memory, wherein the processor executes:

calculating an error signal in accordance with an output from the amplifying unit and the input signal;

controlling, in accordance with correlation information on the input signal, intervals of delay signals which are obtained by giving different amounts of delay to the input signal; and performing predistortion on the input signal by using distortion compensation coefficients and that outputs the input signal subjected to the predistortion to the amplifying unit, the distortion compensation coefficients being generated in accordance with delay signals whose intervals are controlled and the error signal.

* * * * *